(12) United States Patent
Akiyama et al.

(10) Patent No.: US 11,700,734 B2
(45) Date of Patent: Jul. 11, 2023

(54) ORGANIC EL ELEMENT, AND ORGANIC EL DISPLAY PANEL INCLUDING LIGHT-EMITTING LAYER AND FUNCTIONAL LAYER WITH SPECIFIC HOLE AND ELECTRON MOBILITIES RELATIONSHIP

(71) Applicant: JOLED Inc., Tokyo (JP)

(72) Inventors: Toshiyuki Akiyama, Tokyo (JP); Yasuhiro Sekimoto, Tokyo (JP); Muneharu Sato, Tokyo (JP); Shinichiro Ishino, Tokyo (JP); Tomohiko Oda, Tokyo (JP); Mineki Hasegawa, Tokyo (JP)

(73) Assignee: JOLED INC., Tokyo (JP)

( * ) Notice: Subject to any disclaimer, the term of this patent is extended or adjusted under 35 U.S.C. 154(b) by 64 days.

(21) Appl. No.: 16/953,370

(22) Filed: Nov. 20, 2020

(65) Prior Publication Data

US 2021/0167312 A1 Jun. 3, 2021

(30) Foreign Application Priority Data

Nov. 29, 2019 (JP) ................................ 2019-217515

(51) Int. Cl.
| | |
|---|---|
| *H10K 50/11* | (2023.01) |
| *H10K 71/00* | (2023.01) |
| *H10K 101/40* | (2023.01) |
| *H10K 50/16* | (2023.01) |
| *H10K 59/35* | (2023.01) |
| *H10K 101/30* | (2023.01) |

(52) U.S. Cl.
CPC ............ *H10K 50/11* (2023.02); *H10K 71/00* (2023.02); *H10K 50/166* (2023.02); *H10K 59/35* (2023.02); *H10K 2101/30* (2023.02); *H10K 2101/40* (2023.02)

(58) Field of Classification Search
CPC ..................................... H10K 50/11
See application file for complete search history.

(56) References Cited

U.S. PATENT DOCUMENTS

| | | | |
|---|---|---|---|
| 10,826,010 B1* | 11/2020 | Montgomery | ...... H01L 51/5271 |
| 2010/0163853 A1 | 7/2010 | Ogiwara et al. | |
| 2017/0012231 A1 | 1/2017 | Mishima et al. | |
| 2018/0114938 A1* | 4/2018 | Yasukawa | ........... H01L 51/5016 |

(Continued)

FOREIGN PATENT DOCUMENTS

| | | |
|---|---|---|
| JP | 2008-187205 A | 8/2008 |
| JP | 2010-171363 A | 8/2010 |

(Continued)

*Primary Examiner* — Caleb E Henry
(74) *Attorney, Agent, or Firm* — Xsensus LLP

(57) ABSTRACT

An organic electroluminescence element including an anode, a light-emitting layer, a functional layer, and a cathode stacked in this order. The light-emitting layer and the functional layer are in contact with each other. Hole mobility of the light-emitting layer is greater than electron mobility of the light-emitting layer. The electron mobility of the light-emitting layer is equal to or greater than an effective electron mobility of the functional layer. A highest occupied molecular orbital (HOMO) level of a first functional material included in the light-emitting layer is at least 0.4 eV greater than a HOMO level of a second functional material included in the functional layer.

9 Claims, 12 Drawing Sheets

(56) References Cited

U.S. PATENT DOCUMENTS

| | | | |
|---|---|---|---|
| 2019/0372060 A1* | 12/2019 | Li | ........................ H01L 27/3244 |
| 2020/0168148 A1* | 5/2020 | Xiang | ................... G09G 3/3225 |
| 2021/0167312 A1* | 6/2021 | Akiyama | ........... H10K 2101/40 |

FOREIGN PATENT DOCUMENTS

| | | | |
|---|---|---|---|
| JP | 2017-22369 A | 1/2017 |
| JP | 2017-188619 A | 10/2017 |
| JP | 2018-73914 A | 5/2018 |

\* cited by examiner

US 11,700,734 B2

ORGANIC EL ELEMENT, AND ORGANIC EL DISPLAY PANEL INCLUDING LIGHT-EMITTING LAYER AND FUNCTIONAL LAYER WITH SPECIFIC HOLE AND ELECTRON MOBILITIES RELATIONSHIP

CROSS-REFERENCE TO RELATED APPLICATION

This application claims priority to Japanese Patent Application No. 2019-217515, filed Nov. 29, 2019, the contents of which are hereby incorporated by reference in their entirety.

BACKGROUND

Technical Field

The present disclosure relates to improvements in light emission efficiency and lifespan of organic electroluminescence (EL) elements that use fluorescent material as light-emitting material.

Description of Related Art

In recent years, display devices using organic EL elements have become widespread.

An organic EL element has a structure in which at least a light-emitting layer is sandwiched between an anode and a cathode. In a light-emitting layer, energy of excitons generated by recombination of electrons and holes is converted into light. In organic semiconductors, there are two types of excitons (excited states), singlet excitons and triplet excitons, depending on a spin state of electrons, and in fluorescent materials, the energy of singlet excitons is converted into light.

Conventionally, in order to improve light emission efficiency of organic EL elements, measures are taken such as adjusting balance between electrons and holes (for example, see JP 2008-187205) and using a phosphorescent material that emits light due to triplet excitons (for example, see JP 2010-171368).

SUMMARY

The present disclosure describes an organic EL element that uses a fluorescent material, which has a long life while maintaining light emission efficiency.

The organic EL element according to at least one embodiment is an organic EL element including: an anode; a light-emitting layer; a functional layer; and a cathode stacked in this order. The light-emitting layer and the functional layer are in contact with each other. Hole mobility of the light-emitting layer is greater than electron mobility of the light-emitting layer. The electron mobility of the light-emitting layer is equal to or greater than an effective electron mobility of the functional layer. A highest occupied molecular orbital (HOMO) level of a first functional material included in the light-emitting layer is at least 0.4 eV greater than a HOMO level of a second functional material included in the functional layer.

Here, a high lowest unoccupied molecular orbital (LUMO) level or a high HOMO level means that a difference between the level and a vacuum level of an electron is small, that is, potential energy of electrons at the level is large.

The organic EL element according to at least one embodiment can improve exciton density in the light-emitting layer in the vicinity of an interface between the light-emitting layer and the functional layer without increasing hole density of the functional layer. Accordingly, luminance efficiency of the light-emitting layer can be improved while suppressing deterioration of the functional material of the functional layer due to holes and excitons, and life extension of the organic EL element can be expected.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 7A illustrates a state in which a TFT layer is formed on a base, FIG. 7B illustrates a state in which an interlayer insulating layer is formed on a substrate, FIG. 7C illustrates a state in which a pixel electrode material is formed on the interlayer insulating layer, FIG. 7D illustrates a state in which pixel electrodes are formed, and FIG. 7E illustrates a state in which a bank material layer is formed on the interlayer insulating layer and the pixel electrodes.

FIG. 8A illustrates a state in which banks are formed, FIG. 8B illustrates a state in which hole injection layers are formed on the pixel electrodes, and FIG. 8C illustrates a state in which hole transport layers are formed on the hole injection layers.

FIG. 9A illustrates a state in which light-emitting layers are formed on the hole transport layers, FIG. 9B illustrates a state in which a first electron transport layer is formed on the light-emitting layers and the banks, and FIG. 9C illustrates a state in which a second electron transport layer is formed on the first electron transport layer.

FIG. 10A illustrates a state in which an electron injection layer is formed on the second electron transport layer, FIG. 10B illustrates a state in which a counter electrode is formed on the electron injection layer, and FIG. 10C illustrates a state in which a sealing layer is formed on the counter electrode.

DETAILED DESCRIPTION

Figure 1:
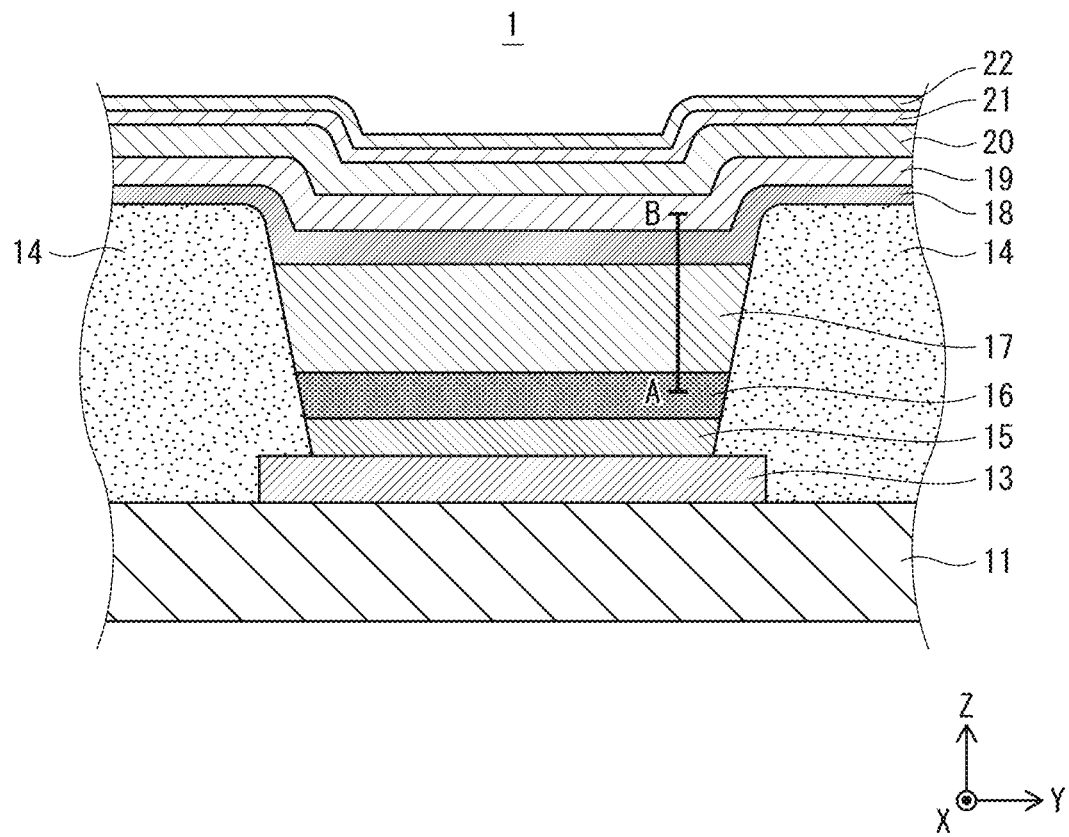
FIG. 1 is a cross-section diagram schematically illustrating structure of an organic EL element 1 according to at least one embodiment.

In order to use organic EL elements as light-emitting elements, it is necessary to generate excitons that are a starting state of light emission. Accordingly, conventionally, hole injection from a hole transport layer to a light-emitting layer and electron injection from an electron transport layer to the light-emitting layer are increased and carrier density in the light-emitting layer is improved in order to increase hole and electron recombination rates. Further, as a structure for further improving carrier density in the light-emitting layer, a highest occupied molecular orbital (HOMO) level of the electron transport layer is adjusted and/or a lowest unoccupied molecular orbital (LUMO) level of the hole transport layer is adjusted, such that hole leakage from the light-emitting layer to the electron transport layer and electron leakage from the light-emitting layer to the hole transport layer can be suppressed. Such a structure can improve carrier density in the light-emitting layer and increase hole and electron recombination rates.

There are two types of excitons in organic materials, singlet excitons and triplet excitons, depending on electron spin state. In a fluorescent material, as described above, singlet excitons contribute to light emission and triplet excitons do not contribute to light emission. A ratio of generation of singlet excitons to triplet excitons is about 1:3, and improving density of singlet excitons is a technical problem.

For fluorescent materials with low light emission efficiency, in particular in blue light emitting materials, which have short emission wavelengths, use of triplet-triplet fusion (TTF) to generate singlet excitons by colliding triplet excitons is being considered as a way to improve singlet exciton density. In order to make use of TTF, density of triplet excitons must be improved, or in other words exciton density must be improved by narrowing a recombination region of electrons and holes.

As a method for narrowing the recombination region of electrons and holes, the recombination region in the light-emitting layer can be localized near the interface with the hole transport layer or near the interface with the electron transport layer, by adjusting a magnitude relation between mobility of holes and mobility of electrons in the light-emitting layer.

However, if the recombination region is simply localized by the magnitude relation between electron mobility and hole mobility in the light-emitting layer, phenomena may occur such as carriers leaking from the light-emitting layer to an adjacent functional layer, recombination in the functional layer, exciton energy generated in the light-emitting layer transitioning to the functional layer, and exciton generation in the functional layer. Accordingly, deterioration of functional material in the functional layer is promoted by carriers and excitons, resulting in a shortening of life of the organic EL element.

Thus, the inventors studied techniques for improving exciton density in the light-emitting layer while reducing density of carriers and excitons in functional layers adjacent to the light-emitting layer, and arrived at the embodiments of the present disclosure.

The organic EL element according to at least one embodiment is an organic EL element including: an anode; a light-emitting layer; a functional layer; and a cathode stacked in this order. The light-emitting layer and the functional layer are in contact with each other. Hole mobility of the light-emitting layer is greater than electron mobility of the light-emitting layer. The electron mobility of the light-emitting layer is equal to or greater than an effective electron mobility of the functional layer. A HOMO level of a first functional material included in the light-emitting layer is at least 0.4 eV greater than a HOMO level of a second functional material included in the functional layer.

A method of manufacturing the organic EL element according to at least one embodiment includes: preparing a substrate; forming an anode above the substrate; forming a light-emitting layer including a fluorescent material as a light-emitting material on or above the anode; forming a functional layer on the light-emitting layer; and forming a cathode on or above the functional layer. Hole mobility of the light-emitting layer is greater than electron mobility of the light-emitting layer. The electron mobility of the light-emitting layer is equal to or greater than an effective electron mobility of the functional layer. A HOMO level of a first functional material included in the light-emitting layer is at least 0.4 eV greater than a HOMO level of a second functional material included in the functional layer.

The organic EL element and the method of manufacturing the organic EL element according to at least one embodiment can improve exciton density in the light-emitting layer in the vicinity of an interface between the light-emitting layer and the functional layer without increasing hole density of the functional layer. Accordingly, luminance efficiency of the light-emitting layer can be improved while suppressing deterioration of the functional material of the functional layer due to holes and excitons, and life extension of the organic EL element can be expected.

According to at least one embodiment, the functional layer includes a first functional sublayer in contact with the light-emitting layer and a second functional sublayer in contact with the first functional sublayer, the second functional material is included in at least the first functional sublayer, and the effective electron mobility of the functional layer is a value derived from an electron mobility of the first functional sublayer and an electron mobility of the second functional sublayer, averaged and weighted by film thickness of the first functional sublayer and film thickness of the second functional sublayer.

Thus, as long as the HOMO level of the functional material included in the light-emitting layer is at least 0.4 eV greater than the HOMO level of the functional material included in the first functional sublayer, it is not necessary to consider the relationship between the HOMO level of the functional material included in the second functional sublayer and the HOMO level of the functional material included in the light-emitting layer. Accordingly, a choice of functional material included in the second functional sublayer is expanded, and it suffices that either electron mobility of the first functional sublayer or electron mobility of the second functional sublayer is higher than electron mobility of light-emitting layer, and therefore it is easy to design the effective electron mobility f the functional layer.

According to at least one embodiment, a LUMO level of the first functional material is at least a LUMO level of the second functional material.

Thus, electron injectability from the functional layer to the light-emitting layer can be controlled by the difference between the LUMO level of the functional material included in the light-emitting layer and the LUMO level of the functional material included in the functional layer.

According to at least one embodiment, a distance between a light emission center of the light-emitting layer and a cathode-side surface of the light-emitting layer is shorter than a distance between the light emission center of the light-emitting layer and an anode-side surface of the light-emitting layer.

Thus, the electron-hole recombination rate can be increased on the cathode side of the center of the light-emitting layer, and life of the organic EL element can be extended while also obtaining a higher luminance efficiency.

According to at least one embodiment, singlet exciton energy in the second functional material is greater than singlet exciton energy in the first functional material.

Thus, singlet exciton energy in the functional material of the light-emitting layer is suppressed from being transferred to the functional layer, which would reduce luminance efficiency, and a portion of singlet exciton energy in the functional material of the functional layer transitions to the light-emitting layer to generate excitons used for light emission, improving luminance efficiency.

According to at least one embodiment, triplet exciton energy in the second functional material is greater than triplet exciton energy in the first functional material.

Thus, triplet exciton energy in the functional material of the light-emitting layer is suppressed from being transferred to the functional layer, which would reduce luminance efficiency, and a portion of triplet exciton energy in the functional material of the functional layer transitions to the light-emitting layer to generate excitons used for light emission, improving luminance efficiency.

The organic EL element according to at least one embodiment is an organic EL element including: an anode; a functional layer; a light-emitting layer; and a cathode stacked in this order. The light-emitting layer and the functional layer are in contact with each other. Electron mobility of the light-emitting layer is greater than hole mobility of the light-emitting layer. The hole mobility of the light-emitting layer is equal to or greater than an effective hole mobility of the functional layer. A LUMO level of a first functional material included in the light-emitting layer is at least 0.4 eV less than a LUMO level of a second functional material included in the functional layer.

The organic EL element according to at least one embodiment can improve exciton density in the light-emitting layer in the vicinity of an interface between the light-emitting layer and the functional layer without increasing electron density of the functional layer. Accordingly, luminance efficiency of the light-emitting layer can be improved while suppressing deterioration of the functional material of the functional layer due to electrons and excitons, and life extension of the organic EL element can be expected.

The organic EL element according to at least one embodiment is an organic EL element including: an anode; a light-emitting layer; a functional layer; and a cathode stacked in this order. The light-emitting layer and the functional layer are in contact with each other. Hole mobility of the light-emitting layer is greater than electron mobility of the light-emitting layer. The electron mobility of the light-emitting layer is equal to or greater than an effective electron mobility of the functional layer. A HOMO level of a first functional material included in the light-emitting layer is at least 0.2 eV greater than a HOMO level of a second functional material included in the functional layer.

The organic EL element according to at least one embodiment can improve exciton density in the light-emitting layer in the vicinity of an interface between the light-emitting layer and the functional layer without increasing hole density of the functional layer. Accordingly, luminance efficiency of the light-emitting layer can be improved while suppressing deterioration of the functional material of the functional layer due to holes and excitons, and life extension of the organic EL element can be expected.

The organic EL element according to at least one embodiment is an organic EL element including: an anode; a functional layer; a light-emitting layer; and a cathode stacked in this order. The light-emitting layer and the functional layer are in contact with each other. Electron mobility of the light-emitting layer is greater than hole mobility of the light-emitting layer. The hole mobility of the light-emitting layer is equal to or greater than an effective hole mobility of the functional layer. A LUMO level of a first functional material included in the light-emitting layer is at least 0.2 eV less than a LUMO level of a second functional material included in the functional layer.

The organic EL element according to at least one embodiment can improve exciton density in the light-emitting layer in the vicinity of an interface between the light-emitting layer and the functional layer without increasing electron density of the functional layer. Accordingly, luminance efficiency of the light-emitting layer can be improved while suppressing deterioration of the functional material of the functional layer due to electrons and excitons, and life extension of the organic EL element can be expected.

An organic EL display panel according to at least one embodiment is an organic EL display panel including a substrate and a plurality of an organic EL element according to at least one embodiment on the substrate.

The following describes organic EL elements according to at least one embodiment of the present disclosure. The following describes illustrative examples for the purpose of explaining structure, action, and effects according to an aspect of the present disclosure, and is not intended to limit the present disclosure except when referring to essential characteristics of the invention.

1. Structure of an Organic EL Element

FIG. 1 is a diagram schematically illustrating a cross-section structure of an organic EL element 1 according to at least one embodiment. The organic EL element 1 includes an anode 13, a hole injection layer 15, a hole transport layer 16, a light-emitting layer 17, a first electron transport layer 18, a second electron transport layer 19, an electron injection layer 20, and a cathode 21.

In the organic EL element 1, the anode 13 and the cathode 21 are arranged so that main surfaces thereof face each other, and the light-emitting layer 17 is disposed between the anode 13 and the cathode 21.

The hole transport layer 16 is in contact with the light-emitting layer 17 on the anode 13 side of the light-emitting layer 17. The hole injection layer 15 is disposed between the hole transport layer 16 and the anode 13.

The first electron transport layer 18 is in contact with the light-emitting layer 17 on the cathode 21 side of the light-emitting layer 17, and the second electron transport layer 19 is in contact with the first electron transport layer 18. The electron injection layer 20 is disposed between the second electron transport layer 19 and the cathode 21.

1.1. Structural Elements of Organic EL Element

<Anode>

The anode 13 is formed on the interlayer insulating layer 12. The anode 13 is a pixel electrode, and for every pixel in a display there is one of the anodes 13. The anode 13 is electrically connected to the TFT layer 112 via a contact hole in the interlayer insulating layer 12.

According to at least one embodiment, the anode 13 is made of a light-reflective metal material. Examples of metal materials that are light-reflective include silver (Ag), aluminum (Al), aluminum alloy, molybdenum (Mo), alloy of silver, palladium, and copper (APC), alloy of silver, rubidium, and gold (ARA), alloy of molybdenum and chromium (MoCr), alloy of molybdenum and tungsten (MoW), alloy of nickel and chromium (NiCr), and the like.

According to at least one embodiment, the anode 13 is a single metal layer of the light-reflective metal material, but according to at least one embodiment, the anode 13 is a laminated structure of a layer of metal oxide such as indium tin oxide (ITO) or indium zinc oxide (IZO) on a metal layer of the light-reflective metal material.

According to at least one embodiment, the cathode 21 is light-reflective, and the anode 13 is light-transmissive. In this case, the anode 13 includes at least one of a metal layer made of a metal material and a metal oxide layer made of a metal oxide. According to at least one embodiment, film thickness of the anode 13 is set to be from 1 nm to 50 nm, and is light-transmissive. The metal material is a light-reflective material, but film thickness of the metal layer is 50 nm or less, and therefore light transmission can be ensured. Accordingly, a portion of light from the light-emitting layer 17 is reflected by the anode 13, and a remainder of the light is transmitted through the anode 13.

When the anode 13 is light-transmissive, examples of the metal material of the metal layer included in the anode 13 include Ag, an alloy mainly composed of Ag, Al, and an alloy mainly composed of Al. Examples of Ag alloys include magnesium silver alloy (MgAg) and indium silver alloy. Ag has a low resistivity, and Ag alloy is preferable in that it has excellent heat resistance and corrosion resistance, and can maintain good electrical conductivity over a long period of time. Examples of Al alloys include magnesium-aluminum alloy (MgAl) and lithium aluminum alloy (LiAl). Examples of other alloys include lithium-magnesium alloy and lithium-indium alloy.

According to at least one embodiment, when the anode 13 is light-transmissive, the metal layer included in the anode 13 is a single Ag layer or an MgAg alloy layer, a laminate of an Mg layer and an Ag layer (Mg/Ag), or a laminate of an MgAg alloy layer and an Ag layer (MgAg/Ag).

When the anode is light-transmissive, examples of a metal oxide of a metal oxide layer included in the anode 13 include indium tin oxide (ITO) and indium zinc oxide (IZO).

<Hole Injection Layer>

The hole injection layer 15 has a function of promoting injection of holes from the anode 13 to the light-emitting layer 17. According to at least one embodiment, the hole injection layer 15 is an applied film, formed by applying and drying a solution of a hole injection material and a solvent. According to at least one embodiment, the hole injection layer 15 is formed by vapor deposition. According to at least one embodiment, the hole injection layer 15 is made of a mixture of polythiophene and polystyrene sulfonate (PEDOT:PSS), polyfluorene, a derivative of polyfluorene, a conductive polymer material such as polyarylamine or a derivative of polyarylamine, or an oxide of Ag, Mo, chromium (Cr), vanadium (V), tungsten (W), nickel (Ni), iridium (Ir), or the like.

<Hole Transport Layer>

The hole transport layer 16 has a function of transporting holes injected from the hole injection layer 15 to the light-emitting layer 17. According to at least one embodiment, the hole transport layer 16 is an applied film, formed by applying and drying a solution of a hole transport material and a solvent. According to at least one embodiment, the hole transport layer 16 is formed by vapor deposition. For example, polyfluorene or a derivative thereof, or a polymer compound such as polyarylamine or a derivative thereof may be used.

<Light-Emitting Layer>

The light-emitting layer 17 has a function of emitting light due to recombination of holes and electrons. Recombination positions of holes and electrons in the light-emitting layer have a distribution, and therefore film thickness of the light-emitting layer is preferably larger than a range of the recombination distribution. According to at least one embodiment, film thickness of the light-emitting layer 17 is 30 nm or more. According to at least one embodiment, film thickness of the light-emitting layer 17 is 40 nm or more. Typically, charge mobility of light-emitting material is lower than charge mobility of charge transport material, and designing a thin light-emitting layer film thickness contributes to a reduction in drive voltage of the elements, and therefore according to at least one embodiment, film thickness of the light-emitting layer 17 is 80 nm or less. According to at least one embodiment, film thickness of the light-emitting layer 17 is 120 nm or less.

According to at least one embodiment, the light-emitting layer 17 is an applied film, formed by applying and drying a solution of a material of the light-emitting layer and a solvent. According to at least one embodiment, the light-emitting layer 17 is formed by vapor deposition.

A known organic material that is a fluorescent substance can be used as a material to form the light-emitting layer 17. Examples include an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and azaquinolone compound, a pyrazoline derivative and pyrazolone derivative, a rhodaimne compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, and an acridine compound.

As described later, according to at least one embodiment, the light-emitting layer 17 has a hole mobility higher than an electron mobility, and a fluorescent material having such a property is used, or an organic material having such a property is used as a host material. According to at least one embodiment, when the fluorescent material is used as a dopant, host material is an amine compound, a condensed polycyclic aromatic compound, or a heterocyclic compound. Examples of an amine compound include a monoamine derivative, a diamine derivative, a triamine derivative, and a tetraamine derivative. Examples of a condensed polycyclic aromatic compound include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Examples of a heterocyclic compound include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

In a case where the light-emitting layer 17 is formed from a fluorescent material and a host material, then according to at least one embodiment, concentration of the fluorescent material is 1 wt % or more. According to at least one embodiment, concentration of the fluorescent material is 10 wt % or less. According to at least one embodiment, concentration of the fluorescent material is 30 wt % or less.

According to at least one embodiment, film thickness of the light-emitting layer is from 20 nm to 60 nm in the case of a blue light-emitting layer and from 50 nm to 150 nm in the case of a green light-emitting layer or red light-emitting layer.

<First Electron Transport Layer>

The first electron transport layer 18 has a function of limiting outflow of holes from the light-emitting layer 17 to the first electron transport layer 18 and controlling injection of electrons from the first electron transport layer 18 into the light-emitting layer 17. The function of controlling outflow of holes from the light-emitting layer 17 to the first electron transport layer 18 is realized by design of an energy band structure that is described later. Further, the function of controlling injection of electrons from the first electron transport layer 18 to the light-emitting layer 17 is realized by design of electron mobility that is described later.

According to at least one embodiment, material of the first electron transport layer 18 has an energy difference (band gap) between LUMO level and HOMO level greater than an energy difference between LIMO level and HOMO level of the light-emitting layer 17. In other words, singlet exciton energy of the first electron transport layer 18 is greater than singlet exciton energy of the light-emitting layer 17. According to this configuration, when singlet excitons are generated in the material of the first electron transport layer 18, transition to singlet excitons of the fluorescent material of the light-emitting layer 17 easily occurs, and outflow of singlet excitons of the fluorescent material of the light-emitting layer 17 to the electron transport layer 18 can be prevented, which contributes to an improvement in light emission efficiency. Similarly, according to at least one embodiment, energy of triplet excitons in material of the first electron transport layer 18 is greater than energy of triplet excitons in material of the light-emitting layer 17.

According to at least one embodiment, the first electron transport layer 18 is formed by vapor deposition. Examples of the material of the first electron transport layer 18 include π-electron low molecular weight organic material such as a pyridine derivative, a pyrimidine derivative, a triazine derivative, an imidazole derivative, an oxadiazole derivative, a triazole derivative, a quinazoline derivative, and a phenanthroline derivative. As will be described later, according to at least one embodiment, the first electron transport layer 18 has a lower electron mobility than the light-emitting layer 17 and a lower electron mobility than the second electron transport layer 19, and includes as a dopant a material that has a lattice mismatch and/or generates an electron trap.

According to at least one embodiment, film thickness of the first electron transport layer 18 is from 10 nm to 30 nm.

<Second Electron Transport Layer>

The second electron transport layer 19 has a function of transporting electrons from the cathode 21 to the light-emitting layer 17 via the first electron transport layer 18. The second electron transport layer 19 is made of an organic material having high electron transportability. According to at least one embodiment, the second electron transport layer 19 is formed by vapor deposition. Examples of the organic material of the second electron transport layer 19 include π-electron low molecular weight organic material such as a pyridine derivative, a pyrimidine derivative, a triazine derivative, an imidazole derivative, an oxadiazole derivative, a triazole derivative, a quinazoline derivative, and a phenanthroline derivative.

According to at least one embodiment, film thickness of the second electron transport layer 19 is from 20 nm to 60 nm.

<Electron Injection Layer>

The electron injection layer 20 has a function of injecting electrons supplied from the cathode 21 towards the light-emitting layer 17. According to at least one embodiment, the electron injection layer 20 is formed by vapor deposition. According to at least one embodiment, the electron injection layer 20 is formed from an organic material that has high electron transport mobility, doped with a metal selected from alkali metals, alkaline earth metals, or rare earth metals. The dopant metal is not limited to being a simple metal, and according to at least one embodiment is a compound such as a fluoride (for example, NaF) or a quinolinium complex (for example, $Alq_3$, Liq). According to at least one embodiment, Li is doped as Liq. Examples of dopant metals include lithium (Li), sodium (Na), potassium (K), rubidium (Rb), cesium (Cs), and francium (Fr), which are alkali metals, calcium (Ca), strontium (Sr), barium (Ba), and radium (Ra), which are alkaline earth metals, and yttrium (Y), samarium (Sm), europium (Eu), and ytterbium (Yb), which are rare earth metals.

According to at least one embodiment, the organic material used in the electron injection layer 20 is a π-electron system low molecular weight organic material, such as an oxydiazole derivative (OXD), a triazole derivative (TAZ), or a phenanthroline derivative (BCP, Bphen).

<Cathode>

The cathode 21 is made from a light-transmissive electrically-conductive material, and is disposed on the electron injection layer 20.

The cathode 21 includes at least one of a metal layer formed from a metal material and a metal oxide layer formed from a metal oxide.

Examples of the metal material of the metal layer included in the cathode 21 include Ag, an alloy mainly composed of Ag, Al, and an alloy mainly composed of Al. Examples of Ag alloys include magnesium silver alloy and indium silver alloy. Examples of Al alloys include magnesium-aluminum alloy and lithium aluminum alloy. Examples of other alloys include lithium-magnesium alloy and lithium-indium alloy.

According to at least one embodiment, the metal layer included in the cathode 21 is a single Ag layer or an MgAg alloy layer, a laminate of an Mg layer and an Ag layer, or a laminate of an MgAg alloy layer and an Ag layer.

Examples of the metal oxide forming the metal oxide layer included in the cathode 21 according to at least one embodiment include ITO and IZO.

According to at least one embodiment, the cathode 21 is a metal layer or a metal oxide layer. According to at least one embodiment, the cathode 21 is a laminate of a metal oxide layer on a metal layer, or a metal layer on a metal oxide layer.

According to at least one embodiment, the anode 13 is light-transmissive, and the cathode 21 is light-reflective. In this case, the cathode 21 includes a metal layer made of a light-reflective metal material. Examples of the light-reflective metal material include silver, aluminum, aluminum alloy, molybdenum, APC, ARA, MoCr, MoW, and NiCr.

<Other Structure>

The organic EL element 1 is formed on the substrate 11. The substrate 11 includes the base 111, which is an insulating material, and the TFT layer 112 on the base 111. Examples of the base 111 include a glass substrate, a silica glass substrate, a silicon substrate, and a plastic substrate. Examples of plastic material of the plastic substrate include thermoplastic resin and thermosetting resin. Examples include polyethylene, polypropylene, polyamide, polyimide (PI), polycarbonate, acrylic resin, polyethylene terephthalate (PET), polybutylene terephthalate, polyacetal, other fluororesins, various thermoplastic elastomers such as styrene-based, polyolefin-based, polyvinyl chloride-based, polyurethane-based, fluororubber-based, and chlorinated polyethylene-based elastomers, epoxy resin, unsaturated polyester, silicone resin, and polyurethane, or a copolymer, a blends, a polymer alloy, or the like mainly composed of the above, or a laminate in which one or more of the above are laminated. Examples of material of the wiring layer 112 include a metal material such as molybdenum sulfide, copper, zinc, aluminum, stainless steel, magnesium, iron, nickel, gold, or silver, an inorganic semiconductor material such as gallium nitride or gallium arsenide, an organic semiconductor material such as anthracene, rubrene, or polyparaphenylene vinylene, or a TFT layer formed using a combination of the above.

Although not illustrated in FIG. 1 the interlayer insulating layer 12 is formed on the substrate 11. The interlayer insulating layer 12 is made from a resin material, and planarizes an uneven upper surface of the TFT layer 112. According to at least one embodiment, the resin material is a positive photosensitive material. Examples of the photosensitive material include acrylic resin, polyimide resin, siloxane resin, and phenol resin. Further, a contact hole is formed for each pixel in the interlayer insulating layer 12.

When the organic EL display panel 100 is a bottom emission panel, the base 111 and the interlayer insulating layer 12 are made of a light-transmissive material. Further, in this case, at least a portion of an area of the TFT layer 112 below the pixel electrode 13 is light-transmissive.

Further, a sealing layer 22 is formed on the organic EL element 1. The sealing layer 22 has a function of suppressing exposure to moisture and air of functional layers such as the hole injection layer 15, the hole transport layer 16, the light-emitting layer 17, the first electron transport layer 18, the second electron transport layer 19, and the electron injection layer 20. According to at least one embodiment, the sealing layer 22 is made of a light-transmissive material such as silicon nitride (SiN) or silicon oxynitride NON). According to at least one embodiment, a sealing resin layer made of a resin material such as an acrylic resin or a silicone resin is provided on the layer formed by using a material such as silicon nitride (SiN) or silicon oxynitride (SiON).

When the organic EL display panel 100 is a top emission panel, the sealing layer 22 is made of a light-transmissive material. Although not illustrated in FIG. 1, a color filter and upper substrate may be bonded on top of the sealing layer 22 via the sealing resin. Bonding the upper substrate further protects the hole injection layer 15, the hole transport layer 16, the light-emitting layer 17, the first electron transport layer 18, the second electron transport layer 19, and the hole injection layer 20 from moisture and air.

2. Energy Band Structure

The organic EL element 1 is characterized by an energy band structure of the light-emitting layer 17, the first electron transport layer 18, and the second electron transport layer 19. For the sake of brevity, layer "energy level" is used as an abbreviation for energy level of the organic material forming a given layer. For layers made of multiple types of material, the energy level of a representative organic material responsible for transporting electrons and/or holes is referred to as the layer "energy level".

Figure 2:
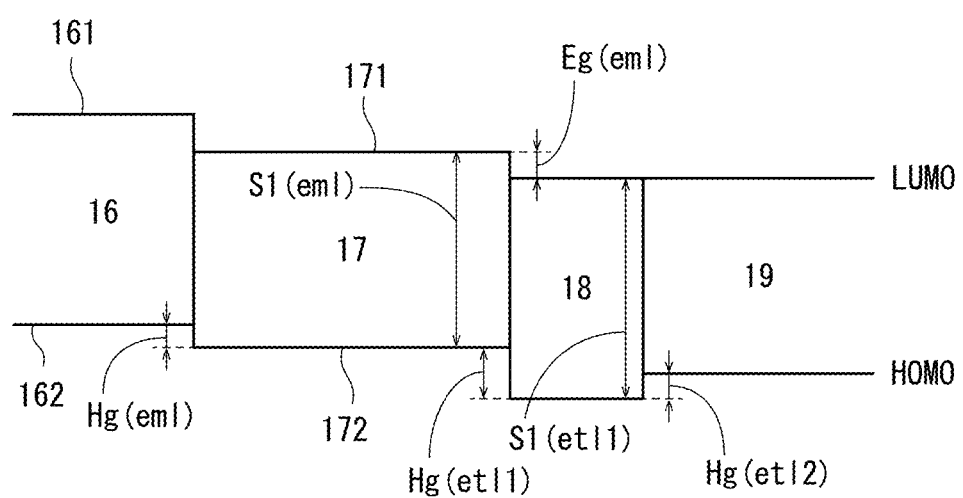
FIG. 2 is a simplified schematic diagram illustrating a band diagram of a hole transport layer, light-emitting layer, first electron transport layer, and second electron transport layer, according to at least one embodiment.

FIG. 2 is a band diagram illustrating an energy band structure of the organic EL element 1. FIG. 2 illustrates the LUMO energy levels (also referred to as "LUMO levels") and the HOMO energy levels (also referred to as "HOMO levels") of the hole transport layer 16, the light-emitting layer 17, the first electron transport layer 18, and the second electron transport layer 19, while omitting other layers. Further, FIG. 2 does not show electron vacuum level, but the lower the LUMO level and HOMO level in the band diagram, the greater the difference from the electron vacuum level, and the lower the energy level.

2.1. Electron Injection Barrier

Energy barriers to injection of electrons from the cathode 21 to the light-emitting layer 17 exist at interfaces between each layer from the cathode 21 to the light-emitting layer 17. These energy barriers are caused by differences in LUMO level at each interface between a layer nearer the anode 13 and a layer nearer the cathode 21. In the following, an energy barrier to injection of electrons from the cathode 21 side to the anode 13 side at an interface between two adjacent layers is referred to as an "electron injection barrier".

An electron injection barrier Eg(etl1) from the second electron transport layer 19 to the first electron transport layer 18 is defined by a difference between a LUMO level 181 of the organic material of the first electron transport layer 18 and a LUMO level 191 of the organic material of the second electron transport layer 19. According to at least one embodiment, the electron injection barrier Eg(etl1) is 0 eV.

An electron injection barrier Eg(eml) from the first electron transport layer 18 to the light-emitting layer 17 is defined by a difference between a LUMO level 171 of the organic material of the light-emitting layer 17 and the LUMO level 181 of the organic material of the first electron transport layer 18. According to at least one embodiment, the electron injection barrier Eg(eml) is 0.1 eV.

2.2. Hole Injection Barrier

On the other hand, energy barriers to injection of holes from the anode 13 to the cathode 21 via the light-emitting layer 17 exist at interfaces between each layer from the anode 13 to the second electron transport layer 19. These energy barriers are caused by differences in HOMO level at each interface between a layer nearer the cathode 21 and a layer nearer the anode 13. In the following, an energy barrier to injection of holes from the anode 13 side to the cathode 21 side at an interface between two adjacent layers is referred to as a "hole injection barrier".

A hole injection barrier Hg(eml) from the hole transport layer 15 to the light-emitting layer 17 is defined by a difference between a HOMO level 172 of the organic material of the light-emitting layer 17 and a HOMO level 162 of the organic material of the hole transport layer 16. According to at least one embodiment, the hole injection barrier Hg(eml) is 0.11 eV.

A hole injection barrier Hg(etl1) from the light-emitting layer 17 to the first electron transport layer 18 is defined by a difference between a HOMO level 182 of the organic material of the first electron transport layer 18 and the HOMO level 172 of the organic material of the light-emitting layer 17. According to at least one embodiment, Hg(etl1) satisfies the following Expression (1). According to at least one embodiment, the hole injection barrier Hg(etl1) is 0.31 eV. According to at least one embodiment, Hg(etl1) satisfies the following Expression (2).

$$Hg(etl1) \geq 0.2 \text{ eV} \quad \text{Expression (1)}$$

$$Hg(etl1) \geq 0.4 \text{ eV} \quad \text{Expression (2)}$$

3. Carrier Mobility Structure

The organic EL element 1 is characterized by carrier mobility of the light-emitting layer 17, the first electron transport layer 18, and the second electron transport layer 19.

As described above, the light-emitting layer 17 has a higher hole mobility than electron mobility. According to at least one embodiment, when electron mobility of the light-emitting layer 17 is $\mu e(eml)$, and hole mobility is $\mu h(eml)$, the following Expression (3) is satisfied:

$$\mu h(eml) > \mu e(eml) \quad \text{Expression (3)}$$

Further, according to at least one embodiment, when effective electron mobility of an entire electron transport layer including the first electron transport layer 18 and the second electron transport layer 19 is $\mu e(etl)$, then the following Expression (4) is satisfied:

$$\mu e(eml) \geq \mu e(etl) \quad \text{Expression (4)}$$

The variable $\mu e(etl)$ is defined by the following Expression (5) when electron mobility of the first electron transport layer 18 is $\mu e(etl1)$, film thickness of the first electron transport layer 18 is $d(etl1)$, electron mobility of the second electron transport layer 19 is $\mu e(etl2)$, and film thickness of the second electron transport layer 19 is $d(etl2)$.

$$\mu e(etl) = \{\mu e(etl1)/d(etl1) + \mu e(etl2)/d(etl2)\} \cdot (d(etl1) + d(etl2)) \quad \text{Expression (5)}$$

4. Effects of Structure
4.1. Expected Effects From Design

Figure 3A:
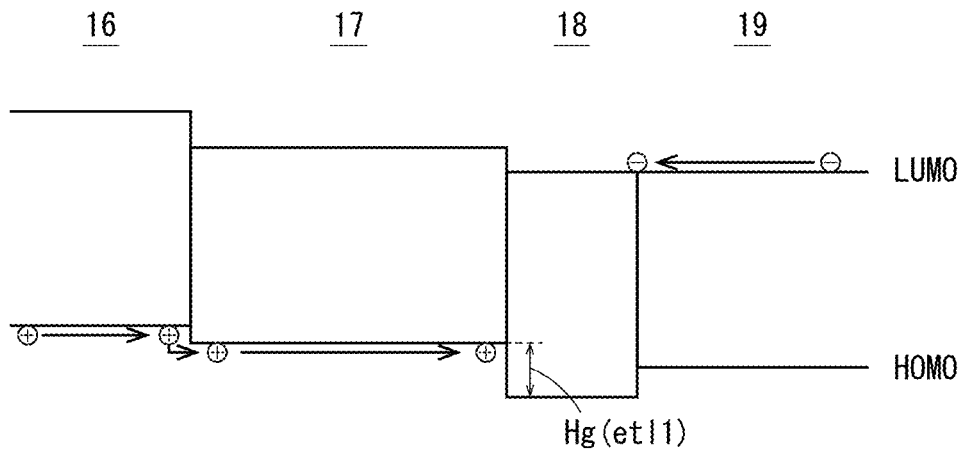
FIGS. 3A, 3B, 3C are simplified schematic diagrams illustrating band diagrams and electron and hole recombination positions of hole transport layers, light-emitting layers, first electron transport layers, and second electron transport layers, according to at least one embodiment and a reference example.
Figure 3B:
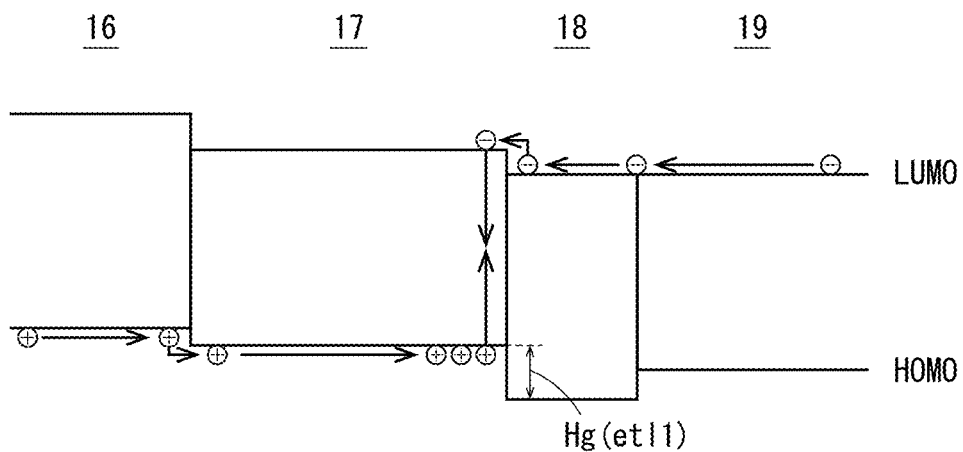
Figure 3C:
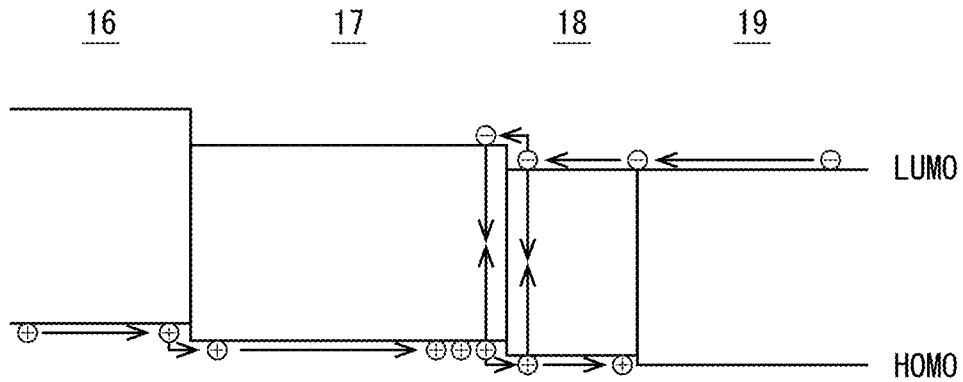

FIG. 3A, 3B, 3C schematically illustrate band diagrams and recombination of electrons and holes with respect to the hole transport layer 16, the light-emitting layer 17, the first electron transport layer 18, and the second electron transport layer 19 according to at least one embodiment and a reference example.

In the organic EL element according to at least one embodiment, as illustrated in FIG. 3A, holes injected from an anode side of the light-emitting layer 17 move to the vicinity of the interface between the light-emitting layer 17 and the electron transport layer 18 because hole mobility of the light-emitting layer 17 is high. However, the hole injection barrier Hg(etl1) from the light-emitting layer 17 to the first electron transport layer 18 is as large as 0.2 eV or more, and therefore hardly any holes are injected into the first electron transport layer 18, and as illustrated in FIG. 3B, holes accumulate in the vicinity of the interface between the light-emitting layer 17 and the first electron transport layer 18. On the other hand, electron mobility of the light-emitting layer 17 is lower than hole mobility of the light-emitting layer 17, and the effective electron mobility of the electron transport layer is equal to or less than electron mobility of the light-emitting layer 17. Accordingly, as illustrated in FIG. 3A, 3B, electron mobility in the light-emitting layer 17, the first electron transport layer 18, and the second electron transport layer 19 is lower than hole mobility in the light-emitting layer 17, and electron injection from the first electron transport layer 18 to the light-emitting layer 17 is the rate-determining process for recombination of electrons and holes in the light-emitting layer 17. Accordingly, an electron-hole recombination region in the light-emitting layer 17 is limited to a narrow region in the vicinity of the interface between the light-emitting layer 17 and the first electron transport layer 18, and therefore exciton density can be easily improved and utilizing the TTF phenomenon becomes easier. Further, exciton generation rate can be controlled by reducing the effective electron mobility of the electron transport layer, and therefore material deterioration due to an excessive improvement in exciton density can be suppressed.

In contrast, FIG. 3C is a schematic diagram of an example in which the hole injection barrier Hg(etl1) from the light-emitting layer 17 to the first electron transport layer 18 is set to less than 0.2 eV. In this case as well, electron mobility of the light-emitting layer 17 is lower than the hole mobility of the light-emitting layer 17, and further, the effective electron mobility of the electron transport layer is equal to or less than electron mobility of the light-emitting layer 17, and therefore an electron-hole recombination region in the light-emitting layer 17 is in the vicinity of the interface between the light-emitting layer 17 and the first electron transport layer 18. However, when the hole injection barrier Hg(etl1) from the light-emitting layer 17 to the first electron transport layer 18 is insufficiently high, holes that accumulate in the vicinity of the interface between the light-emitting layer 17 and the first electron transport layer 18 overcome the hole injection barrier Hg(etl1) and are injected into the first electron transport layer 18. This causes recombination to occur in the first electron transport layer 18 and the second electron transport layer 19, generating excitons and promoting material deterioration. In other words, a longer lifespan is expected for an embodiment than for the reference example.

Further, according to at least one embodiment, singlet exciton energy (bandgap) of the material of the first electron transport layer 18 is greater than singlet exciton energy (bandgap) of the fluorescent material of the light-emitting layer 17. The singlet exciton energy of the material of the first electron transport layer 18 is greater than the singlet exciton energy of the fluorescent material, and therefore (a) when holes are injected into the first electron transport layer 18, recombination occurs in the first electron transport layer 18, and singlet excitons are generated, it can be expected that the fluorescent material is excited and transitions to singlet excitons of the fluorescent material occur, and (b) excitation of the material of the electron transport layer 18 by singlet excitons of the fluorescent material is suppressed. Similarly, according to at least one embodiment, energy of triplet excitons in the material of the first electron transport layer 18 is greater than energy of triplet excitons in the fluorescent material of the light-emitting layer 17. As a result, (a) when triplet excitons are generated in the first electron transport layer 18, it can be expected that the fluorescent material is excited and transitions to triplet excitons of the fluorescent material occur, and (b) the triplet excitons of the fluorescent material can prevent excitation of the material of the first electron transport layer 18.

4.2. Evaluation Results

The following describes characteristics of the organic EL elements according to at least one embodiment together with evaluation results.

First, a description of relationships between electron mobility of the electron transport layer, electron mobility of the light-emitting layer, the hole injection barrier Hg(etl) from the light-emitting layer to the electron transport layer, and luminous efficiency when the electron transport layer is one layer.

Figure 4A:
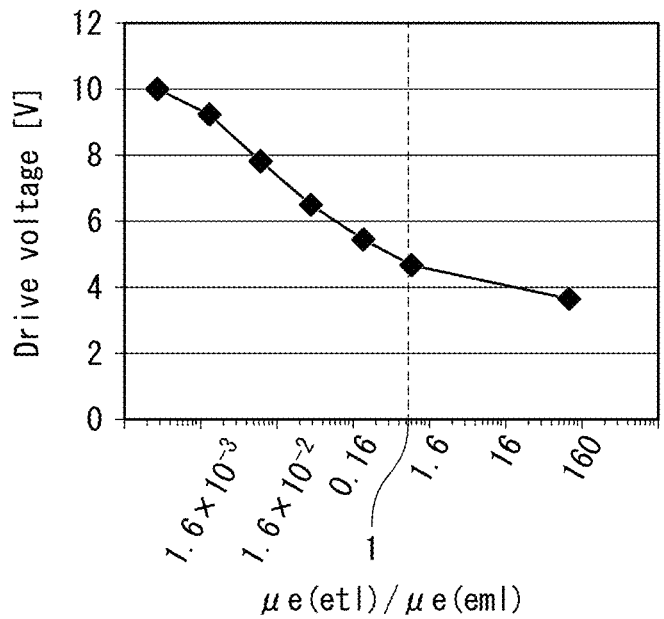
FIG. 4A is a graph illustrating a relationship between electron mobility of an electron transport layer and drive voltage of an organic EL element.

FIG. 4A is a graph illustrating the relationship between electron mobility of the electron transport layer and drive voltage of the organic EL element when electron mobility of the light-emitting layer 17 is constant and electron mobility of the electron transport layer is changed. Electron mobility of the electron transport layer is shown as a value relative to an electron mobility of 1 for the light-emitting layer. Further, the value for the hole injection barrier Hg(etl) from the light-emitting layer to the electron transport layer is set as 0.44 eV.

As illustrated in FIG. 4A, when electron mobility of the electron transport layer decreases, drive voltage of the organic EL element increases. In particular. When electron mobility of the electron transport layer is less than electron mobility of the light-emitting layer 17 (the relative value is less than 1), drive voltage of the organic EL element increases steeply as electron mobility of the electron transport layer decreases. On the other hand, when electron mobility of the electron transport layer is greater than electron mobility of the light-emitting layer 17 (the relative value is greater than), drive voltage of the organic EL element decreases gradually as electron mobility of the electron transport layer increases. Accordingly, in order to suppress variation in drive voltage, it can be said that electron mobility of the electron transport layer is preferably higher than electron mobility of the light-emitting layer. Further, in order to not excessively increase drive voltage of the organic EL element, electron mobility of the electron transport layer is preferably about 0.01 times or more than electron mobility of the light-emitting layer.

Figure 4B:
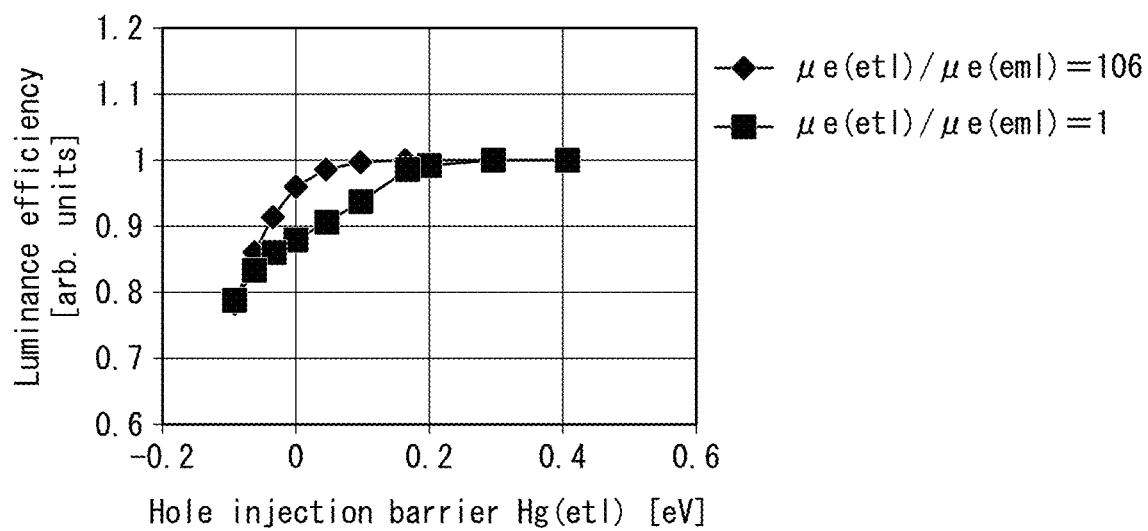
FIG. 4B is a graph illustrating a relationship between a hole injection barrier Hg(etl1) from a light-emitting layer to a first electron transport layer and light emission efficiency of an organic EL element 1.

FIG. 4B is a graph illustrating a relationship between the hole injection barrier Hg(etl) from the light-emitting layer to the election transport layer and luminance efficiency of the organic EL element. FIG. 4B shows two cases, one in which electron mobility of the electron transport layer is approximately 107 times electron mobility of the light-emitting layer 17, and one in which the electron mobilities are approximately equivalent.

As shown in FIG. 4B, when electron mobility of the electron transport layer is about 107 times electron mobility of the light-emitting layer, when the hole injection barrier Hg(etl) is 0.1 eV or more, efficiency is almost maximum, and when the hole injection barrier Hg(etl) is less than 0.1 eV, luminous efficiency decreases as the hole injection barrier Hg(etl) decreases. Further, when electron mobility of the electron transport layer is approximately equal to electron mobility of the light-emitting layer, when the hole injection barrier Hg(etl) is 0.2 eV or more, efficiency is almost maximum, and when the hole injection barrier Hg(etl) is less than 0.2 eV, luminous efficiency decreases as the hole injection barrier Hg(etl) decreases. That is, when electron mobility of the electron transport layer is greater than electron mobility of the light-emitting layer, as long as the hole injection batter Hg(etl) is 0.2 eV or more, a decrease in luminance efficiency due to outflow of holes from the light-emitting layer to the electron transport layer can be suppressed.

However, depending on the material of the light-emitting layer, formation of non-light-emitting sites may be promoted by electrons. When such a material is used, in order to improve luminance efficiency, formation of non-light-emitting sites is suppressed by suppressing injection of electrons into the light-emitting layer. Therefore, according to at least one embodiment, the effective electron mobility of the electron transport layer is reduced to be equal to or lower than electron mobility of the light-emitting layer 17.

Figure 5:
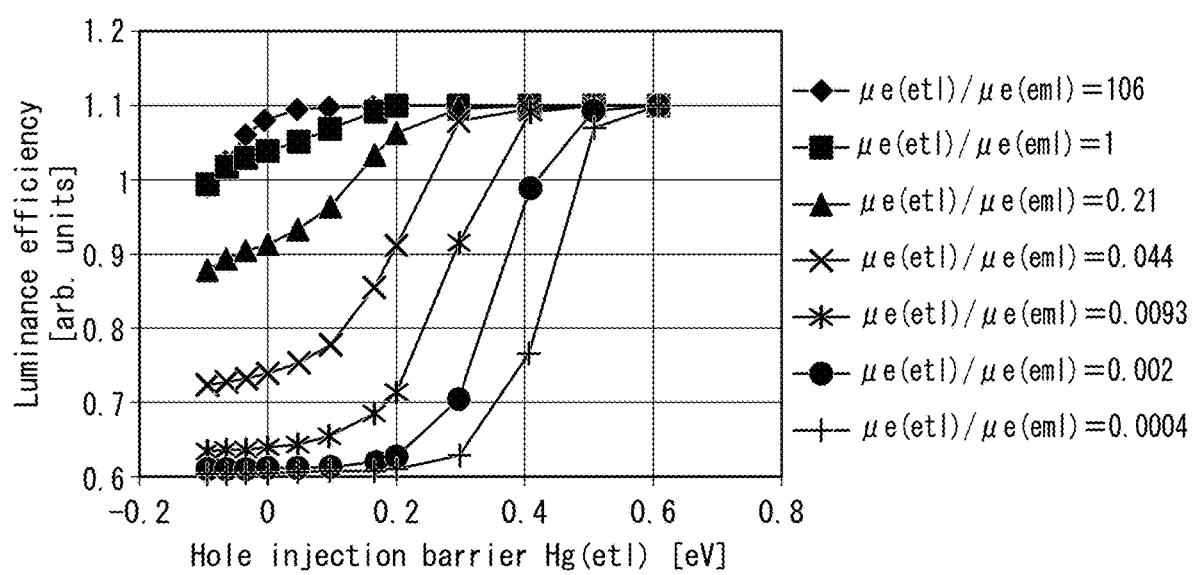
FIG. 5 is a graph illustrating a relationship between a hole injection barrier Hg(etl1) from a light-emitting layer to a first electron transport layer and light emission efficiency of an organic EL element 1, when electron mobility of an electron transport layer is changed.

FIG. 5 is a graph illustrating a relationship between values of the hole injection barrier Hg(etl) from the light-emitting layer to the electron transport layer and luminance efficiency, for each electron mobility value of the electron transport layer, when electron mobility of the electron transport layer is lower than electron mobility of the light-emitting layer. Electron mobility of the electron transport layer is shown as a value relative to an electron mobility of 1 for the light-emitting layer. As described above, drive voltage increases as electron mobility of the electron transport layer becomes lower relative to electron mobility of the light-emitting layer, but as shown in FIG. 5, a minimum value of the hole injection barrier Hg(etl) required to suppress a decrease in luminance efficiency due to hole outflow from the light-emitting layer to the electron transport layer also increases. That is, when electron mobility of the electron transport layer is 106 times or equivalent to electron mobility of the light-emitting layer, efficiency is maximized when the hole injection barrier Hg(etl) is 0.2 eV or more, but, for example, when electron mobility of the electron transport layer is 0.21 times or 0.044 times electron mobility of the light-emitting layer, efficiency is maximized when the hole injection barrier Hg(etl) is 0.3 eV or more. Further, when electron mobility of the electron transport layer is about 0.01 times electron mobility of the light-emitting layer, efficiency is maximized when the hole injection barrier Hg(etl) is 0.4 eV or more. Further, when electron mobility of the electron transport layer is 0.002 or less times electron mobility of the light-emitting layer, the hole injection barrier Hg(etl) needs to be about 0.5 eV to 0.6 eV or more to maximize efficiency. As described above, in order to not excessively increase drive voltage of the organic EL element, electron mobility of the electron transport layer is preferably about 0.01 times or more the electron mobility of the light-emitting layer, and therefore the hole injection barrier Hg(etl) is 0.4 eV or more, according to at least one embodiment.

4.2 Light Emission Center

The following describes a light emission center of the light-emitting layer. The light emission center indicates a representative position at which a light emission peak occurs, as described below. A position of the light emission peak is a position where excitons of the light-emitting material are concentrated, and is generally one or both of an anode side interface of the light-emitting layer and a cathode side interface of the light-emitting layer. When hole mobility in the light-emitting layer is sufficiently higher than electron mobility in the light-emitting layer, holes move to the cathode side interface of the light-emitting layer, where electrons are consumed by recombination in the vicinity of the cathode side interface of the light-emitting layer, and therefore excitons are intensively generated in the vicinity of the cathode side interface of the light-emitting layer. When electron mobility in the light-emitting layer is sufficiently higher than hole mobility in the light-emitting layer, electrons move the anode side interface of the light-emitting layer, where holes are consumed by recombination in the vicinity of the anode-side interface of the light-emitting layer, and therefore excitons are intensively generated in the vicinity of the anode side interface of the light-emitting layer. Further, depending on the relationship between hole mobility and electron mobility in the light-emitting layer, excitons may be intensively generated both in the vicinity of the anode side interface and in the vicinity of the cathode side interface of the light-emitting layer. Typically, a position where excitons are intensively generated becomes the position of the light emission peak.

When exciton diffusion characteristics are high and exciton lifetime is long for the light-emitting material, a position where excitons are intensively generated and the position of the light emission peak may not always match due to diffusion of excitons. In such a case, the light emission center is not a position where excitons are intensively generated, but a position where transition from exciton energy to photon energy is intensively generated.

5. Review

As described above, in the organic EL element according to at least one embodiment, hole mobility is higher than electron mobility in the light-emitting layer 17. Thus, an electron-hole recombination region in the light-emitting layer 17 can be a narrow region in the vicinity of the interface between the light-emitting layer 17 and the electron transport layer, and exciton density can be increased to improve luminance efficiency by TTF. Further, in the organic EL element according to at least one embodiment, the effective electron mobility of the electron transport layer is equal to or less than electron mobility of the light-emitting layer 17. Accordingly, generation of excitons by recombination can be controlled by electron injection from the first electron transport layer 18 to the light-emitting layer 17, and deterioration of light-emitting material due to electrons and excitons can be suppressed.

Further, in the organic EL element according to at least one embodiment, the HOMO level of the material of the light-emitting layer 17 is at least 0.2 eV more than the HOMO level of the material of the first electron transport layer 18. According to at least one embodiment, at least 0.4 eV more. Thus, leakage of holes from the light-emitting layer 17 to the first electron transport layer 18 is suppressed, and hole density in the vicinity of the interface between the light-emitting layer 17 and the first electron transport layer 18 can be improved. Accordingly, the recombination region can be prevented from expanding to outside the light-emitting layer 17, and in particular to the first electron transport layer 18, improving luminance efficiency and suppressing deterioration of functional material due to holes and excitons.

6. Modifications

Figure 6A:
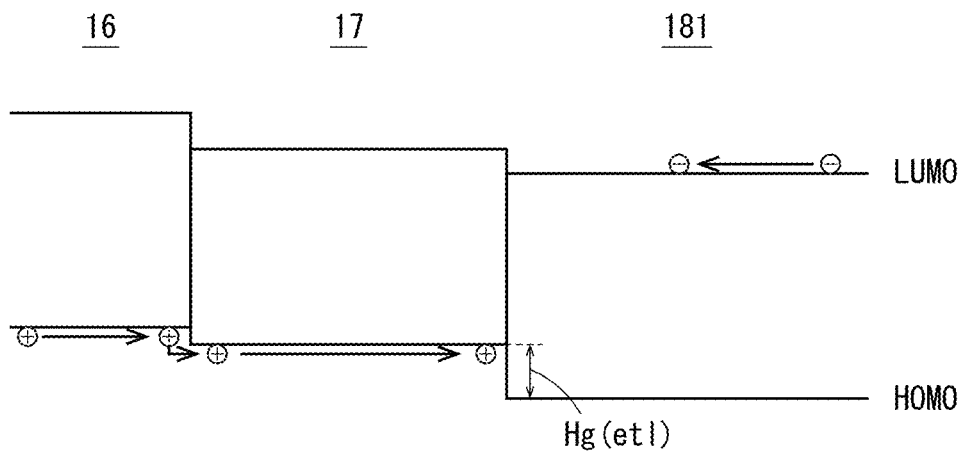
FIGS. 6A, 6B are simplified schematic diagrams illustrating band diagrams and electron and hole recombination positions of hole transport layers, light-emitting layers, first electron transport layers, and second electron transport layers, according to a modification.
Figure 6B:
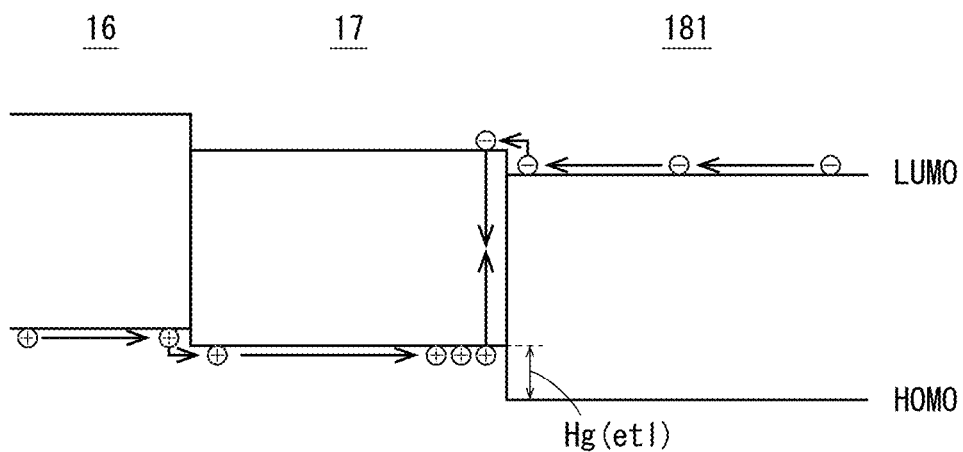

FIG. 6A, 6B are band diagrams of the hole transport layer 16, the light-emitting layer 17, and an electron transport layer 181, and schematic diagrams illustrating recombination of electrons and holes, according to at least one modification.

The organic EL element according to at least one modification is characterized in that it includes the electron transport layer 181 instead of the first electron transport layer 18 and the second electron transport layer 19. The electron transport layer 181 has the hole injection barrier Hg(etl) from the light-emitting layer 17 to the electron transport layer 181, defined by a difference between HOMO level of the organic material of the electron transport layer 181 and HOMO level of the organic material of the light-emitting layer 17, and satisfying Expression (1) or Expression (2). That is, Hg(etl)≥0.2 eV or Hg(etl)≥0.4 eV is satisfied. Further, the electron transport layer 181, when electron mobility thereof is µe(etl), satisfies Expression (4). That is, µe(eml)≥µe(etl) is satisfied.

In the organic EL element according to at least one modification, as in the organic EL element according to at least one embodiment, hole mobility is higher than electron mobility in the light-emitting layer 17. Accordingly, as illustrated in FIG. 6A, holes injected from an anode side of the light-emitting layer 17 move to the vicinity of the interface between the light-emitting layer 17 and the electron transport layer 181 because hole mobility of the light-emitting layer 17 is high. However, the hole injection barrier Hg(etl) from the light-emitting layer 17 to the electron transport layer 181 is 0.2 eV or more. Accordingly, hardly any holes are injected from the light-emitting layer 17 to the electron transport layer 181, and as illustrated in FIG. 6B, holes accumulate in the vicinity of the interface between the light-emitting layer 17 and the electron transport layer 181.

On the other hand, in the organic EL element according to at least one modification, electron mobility of the light-emitting layer 17 is lower than hole mobility of the light-emitting layer 17, and electron mobility of the electron transport layer 181 is equal to or less than electron mobility of the light-emitting layer 17. Accordingly, as illustrated in FIG. 6A, 6B, mobility of electrons in the light-emitting layer 17 from the electron transport layer 181 is lower than mobility of holes in the light-emitting layer 17, and electron injection from the electron transport layer 181 to the light-emitting layer 17 is the rate-determining process of electron-hole recombination in the light-emitting layer 17. Accordingly, an electron-hole recombination region in the light-emitting layer 17 is limited to a narrow region in the vicinity of the interface between the light-emitting layer 17 and the electron transport layer 181, and therefore exciton density can be easily improved and utilizing the TTF phenomenon becomes easier. Further, exciton generation rate can be controlled by reducing the effective electron mobility of the electron transport layer, and therefore material deterioration due to an excessive improvement in exciton density can be suppressed.

Singlet exciton energy of the material of the electron transport layer 181 is preferably greater than singlet exciton energy of the fluorescent material of the light-emitting layer 17. Similarly, triplet exciton energy of the material of the electron transport layer 181 is preferably greater than triplet exciton energy of the fluorescent material of the light-emitting layer 17.

As described above, even when the electron transport layer is one layer, it suffices that conditions (a) and (b) are satisfied, where (a) is that the hole injection barrier Hg(etl) from the light-emitting layer to the electron transport layer adjacent to the light-emitting layer satisfies Expression (1) or Expression (2), and (b) is that electron mobility of the electron transport layer is equal to or less than electron mobility of the light-emitting layer. Further, it is preferable that (c) singlet and triplet exciton energy in the electron transport layer adjacent to the light-emitting layer is greater than singlet and triplet exciton energy in the light-emitting layer. The electron transport layer may be three or more layers. In this case, the electron transport layer adjacent to the light-emitting layer satisfies condition (a), and preferably satisfies condition (c), and the effective electron mobility of the electron transport layer as a whole satisfies condition (b). By structuring the electron transport layer to satisfy the conditions above, luminance efficiency is improved and deterioration of functional material due to carriers and excitons can be suppressed, as per the organic EL element according to at least one embodiment.

7. Manufacture of Organic EL Element

A method of manufacturing the organic EL element is described below, with reference to the drawings. FIG. 7A to FIG. 10C are schematic cross-section diagrams illustrating states in manufacture of an organic EL display panel including the organic EL element. FIG. 11 is a flowchart illustrating the method of manufacturing the organic EL display panel including the organic EL element.

In the organic EL display panel, the pixel electrode (lower electrode) functions as the anode of the organic EL element and the counter electrode (upper electrode, common electrode) functions as the cathode of the organic EL element, (1) Forming Substrate 11

Figure 7A:
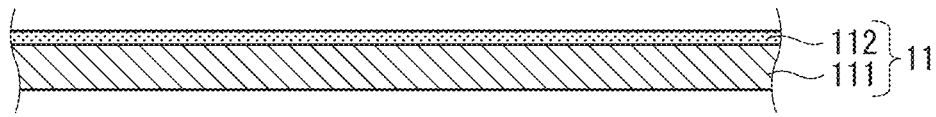
FIGS. 7A, 7B, 7C, 7D, 7E are cross-section diagrams schematically illustrating steps in manufacture of organic EL elements according to at least one embodiment, where

First, as illustrated in FIG. 7A, the TFT layer 112 is formed on the base 111 to form the substrate 11 (step S10 in FIG. 11). The TFT layer 112 can be formed by a known TFT manufacturing method.

Figure 7B:
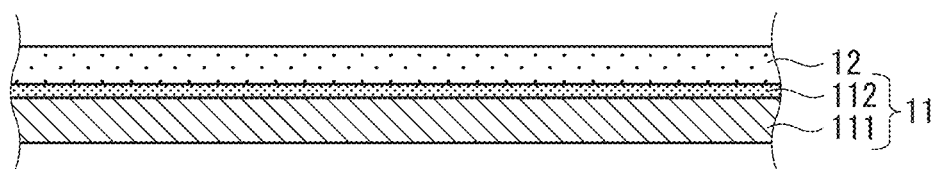

Next, as illustrated in FIG. 7B, the interlayer insulating layer 12 is formed on the substrate 11 (step S20 in FIG. 11). The interlayer insulating layer 12 can be formed by using a method such as plasma chemical vapor deposition (CVD) or sputtering.

Next, dry etching forms contact holes in the interlayer insulating layer 12 at positions above source electrodes of the TFT layer 112. The contact holes are formed so as to expose top surfaces of the source electrodes.

Next, connecting electrode layers are formed along inner walls of the contact holes. Portions of the connecting electrode layers are disposed on the interlayer insulating layer 12. The connecting electrode layers can be formed by using a sputtering method, for example, then after a metal film is formed, using photolithography and wet etching to pattern the metal film.

(2) Forming Pixel Electrode 13

Figure 7C:
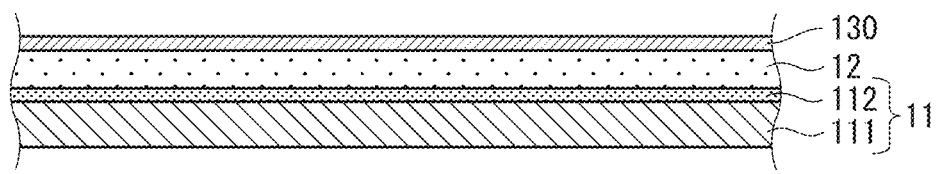

Next, as illustrated in FIG. 7C, a pixel electrode material layer 130 is formed on the interlayer insulating layer 12 (step S31 in FIG. 11). The pixel electrode material layer 130 can be formed by using vacuum deposition, sputtering, or the like.

Figure 7D:
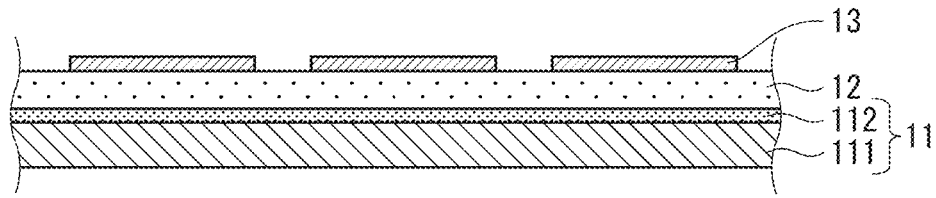

Next, as illustrated in FIG. 7D, etching is used to pattern the pixel electrode material layer 130, forming a plurality of the pixel electrodes 13 partitioned into sub-pixels (step S32 in FIG. 11). The pixel electrodes 13 function as anodes for each organic EL element.

Forming the pixel electrodes 13 is not limited to the above method. According to at least one embodiment, a hole injection material layer 150 is formed on the pixel electrode material layer 130, and both the pixel electrode material layer 130 and the hole injection material layer 150 are patterned by etching to form the pixel electrodes 13 and the hole injection layers 15 together.

(3) Forming Banks 14

Figure 7E:
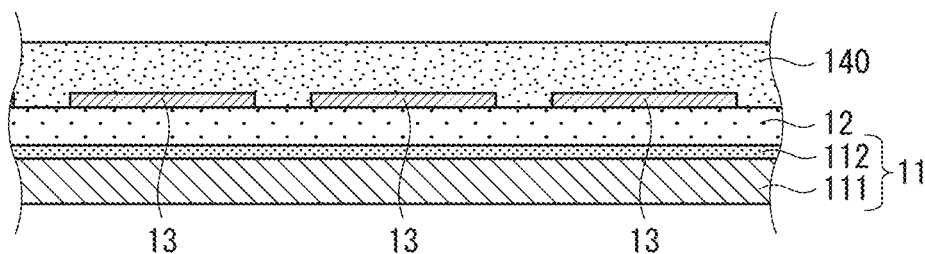

Next, as illustrated in FIG. 7E, bank resin, which is a material of the banks 14, is applied on the pixel electrodes 13 and the interlayer insulating layer 12 to form a bank material layer 140. The bank material layer 140 is formed by uniformly applying a solution of phenol resin dissolved in a solvent (such as a mixed solvent of ethyl lactate and γ-Butyrolactone (GBL)) onto the pixel electrodes 13 and the interlayer insulating layer 12 by a method such as spin coating (step S41 in FIG. 11). Next, the banks 14 are formed by light exposure patterning and developing of the bank material layer 140 (FIG. 8A, step S42 in FIG. 11) and baking the banks 14. Thus, the openings 14a are defined, which are regions in which the light-emitting layers 17 are formed. Baking of the banks 14 is performed, for example, at a temperature in a range from 150° C. to 210° C. for 60 minutes.

Further, according to at least one embodiment, surfaces of the banks 14 are treated with a defined alkaline solution, water, an organic solvent, or the like, or subjected to plasma treatment. This is done in order to adjust the contact angle of the banks 14 with respect to inks (solutions) applied into the openings 14a, or in order to impart water repellency to the surfaces.

(4) Forming Hole Injection Layers 15

Figure 8A:
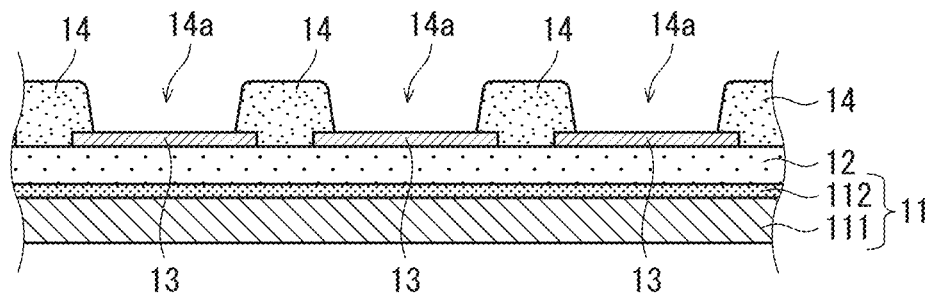
FIGS. 8A, 8B, 8C, are cross-section diagrams schematically illustrating steps in manufacture of organic EL elements according to at least one embodiment, where
Figure 8B:
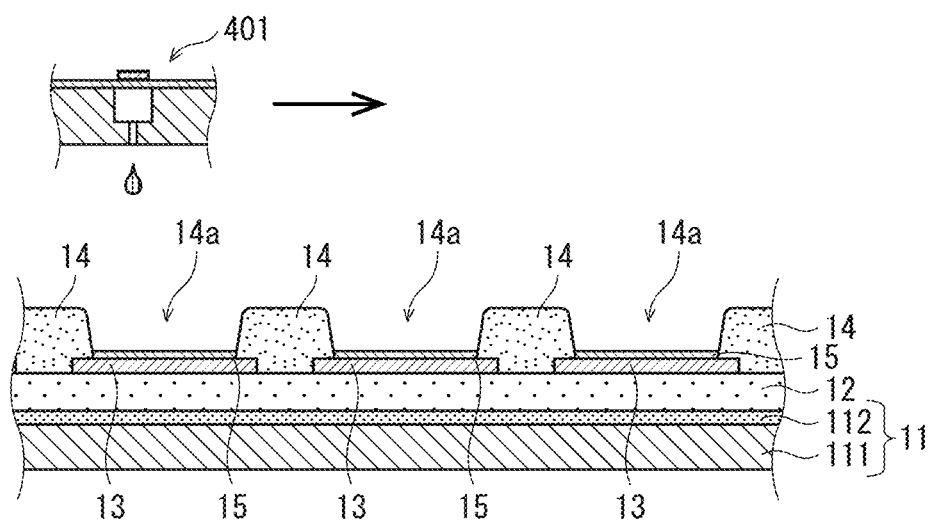

Next, as illustrated in FIG. 8B, ink including material of the hole injection layers 15 is ejected from nozzles of an inkjet head 401 into the openings 14a defined by the banks 14 onto the pixel electrodes 13 in the openings 14a, then baked (dried) to form the hole injection layers 15 (step S50 in FIG. 11).

(5) Forming Hole Transport Layers 16

Figure 8C:
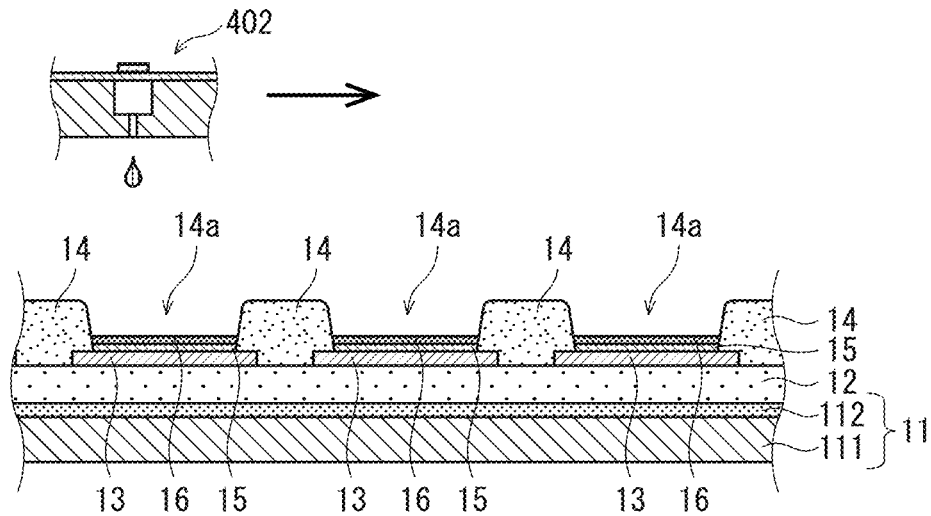

Next, as illustrated in FIG. 8C, ink including material of the hole transport layers 16 is ejected from nozzles of an inkjet head 402 into the openings 14a defined by the banks 14 onto the hole injection layer 15 in the openings 14a, then baked (dried) to form the hole transport layers 16 (step S50 in FIG. 11).

(6) Forming Light-Emitting Layers 17

Figure 9A:
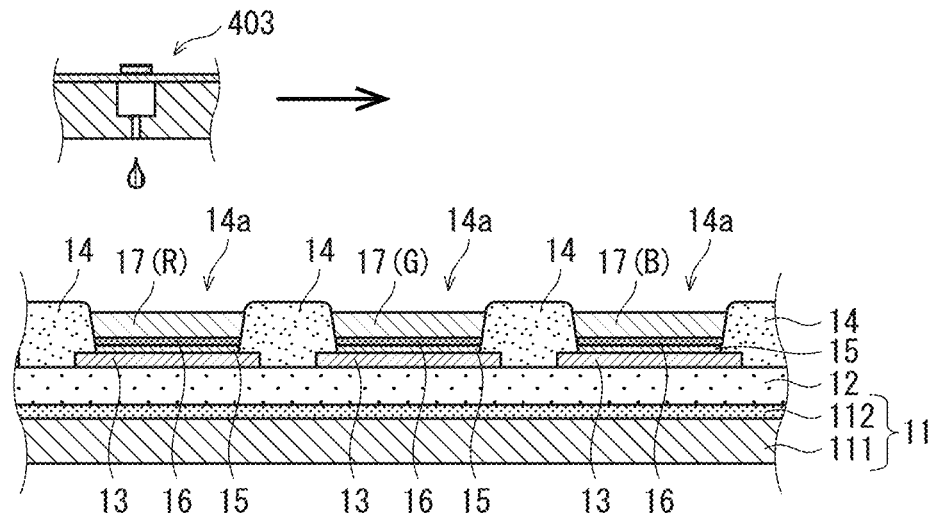
FIGS. 9A, 9B, 9C are cross-section diagrams schematically illustrating steps in manufacture of organic EL elements according to at least one embodiment, where

Next, as illustrated in FIG. 9A, ink including material of the light-emitting layers 17 is ejected from nozzles of an inkjet head 403 onto the hole transport layers 16 in the openings 14a, then baked (dried) to form the light-emitting layers 17 (step S70 in FIG. 11).

(7) Forming First Electron Transport Layer 18

Figure 9B:
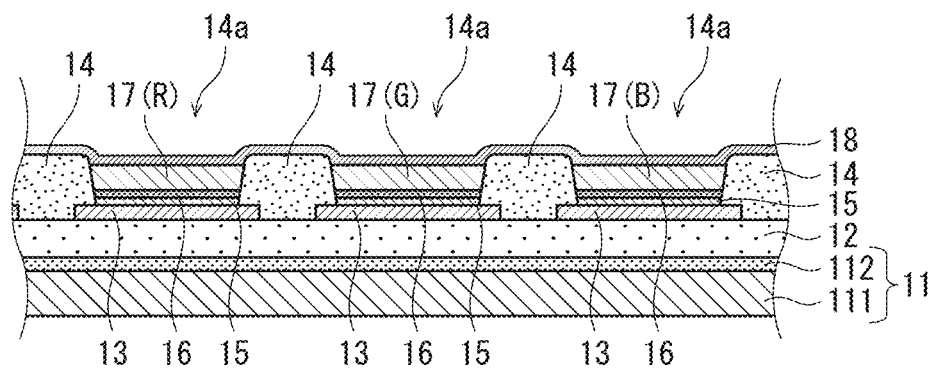

Next, as illustrated in FIG. 9B, the first electron transport layer 18 is formed on the light-emitting layers 17 and the banks 14 (step S80 in FIG. 11). The first electron transport layer 18 is, for example, formed by using vapor deposition of an organic compound that is a material of the first electron transport layer 18 to form a film across all sub-pixels.

(8) Forming Second Electron Transport Layer 19

Figure 9C:
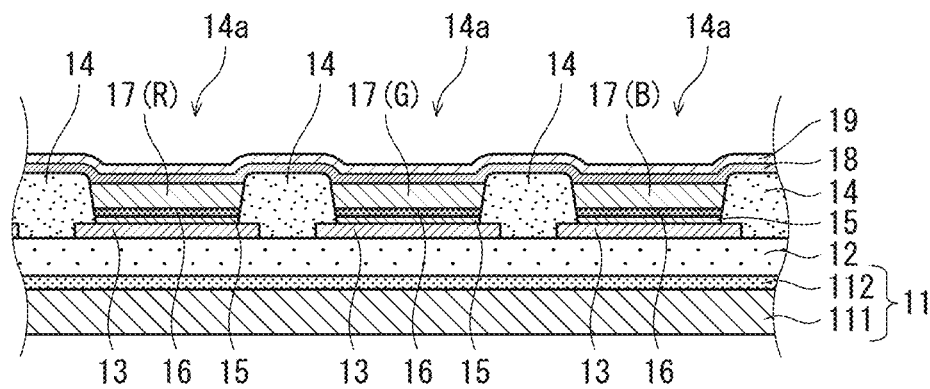

Next, as illustrated in FIG. 9C, the second electron transport layer 19 is formed on the first electron transport layer 18 (step S90 in FIG. 11). The second electron transport layer 19 is, for example, formed by using vapor deposition of an electron-transporting organic material to form a film across all sub-pixels.

(9) Forming Electron Injection Layer 20

Figure 10A:
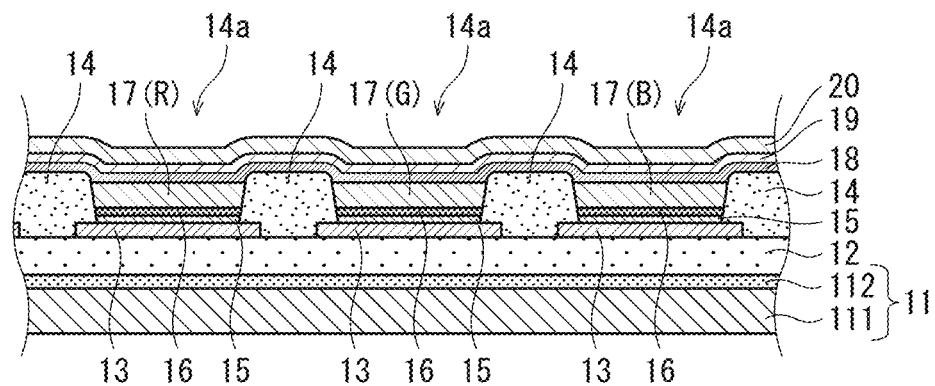
FIG. 10A, 10B, 10C are cross-section diagrams schematically illustrating steps in manufacture of organic EL elements according to at least one embodiment, where
Figure 11:
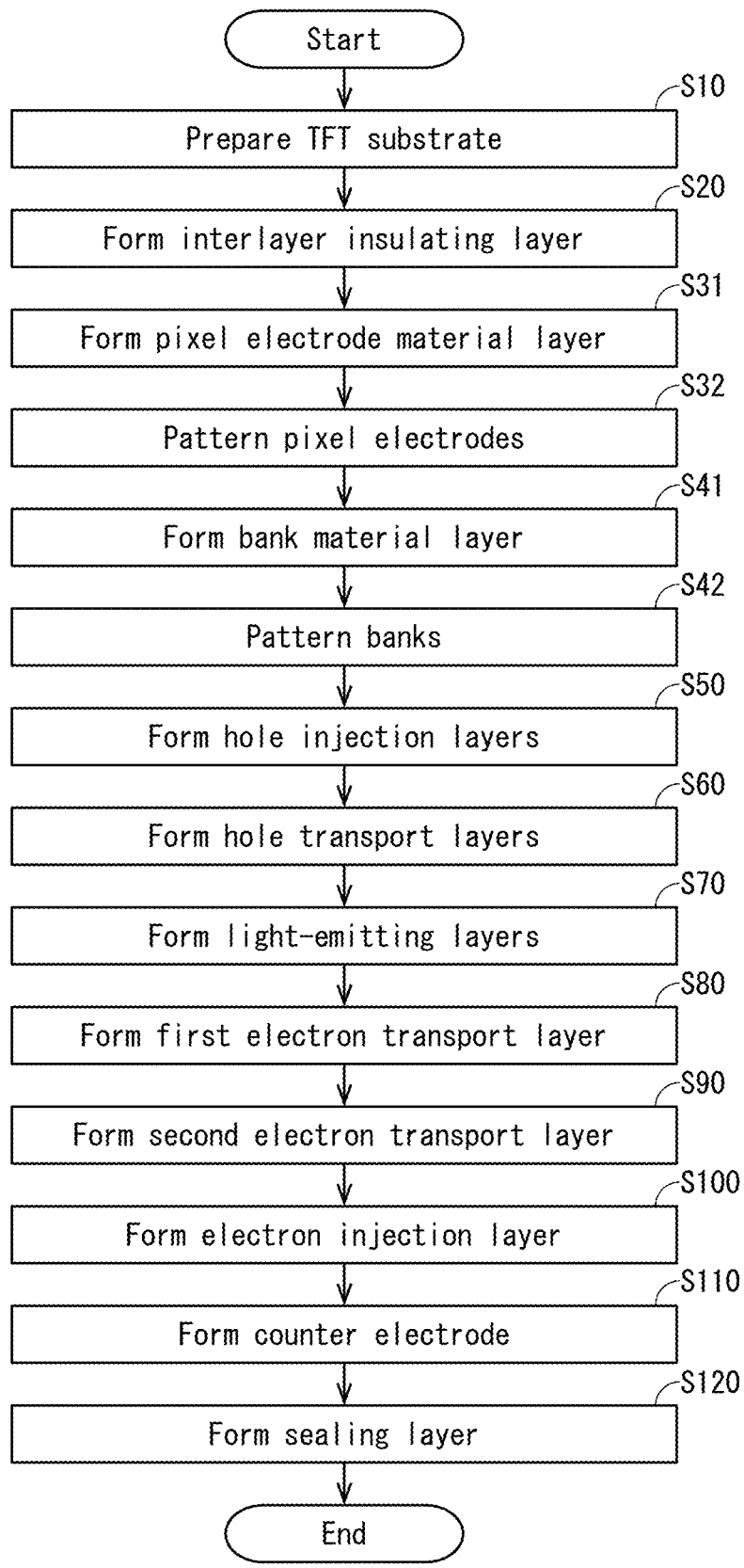
FIG. 11 is a flowchart illustrating an organic EL element manufacturing process according to at least one embodiment.

Next, as illustrated in FIG. 10A, the electron injection layer 20 is formed on the second electron transport layer 19 (step S100 in FIG. 11), The electron injection layer 20 is, for example, formed by using co-deposition of an electron-transporting organic material and a metal dopant to form a film across all sub-pixels.

(10) Forming Counter Electrode 21

Figure 10B:
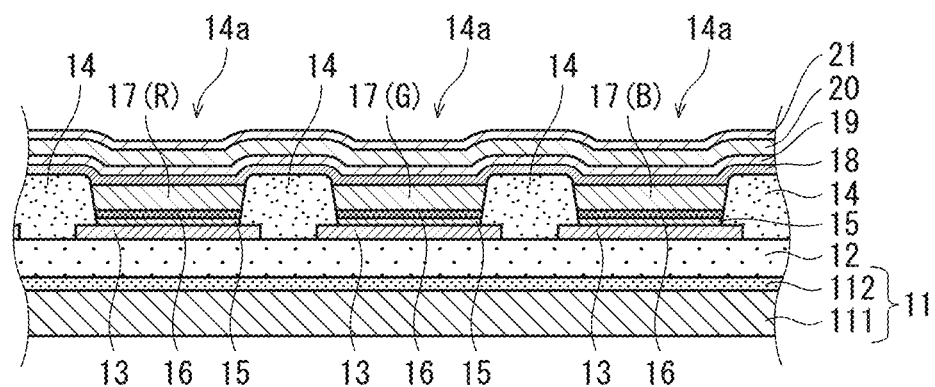

Next, as illustrated in FIG. 10B, the counter electrode 21 is formed on the hole injection layer 20 (step S110 of FIG. 11). The counter electrode 21 is formed by forming a film of ITO, IZO, silver, aluminum, or the like, by a sputtering method or a vacuum deposition method. The counter electrode 21 functions as a cathode for each organic EL element.

(11) Forming Sealing Layer 22

Figure 10C:
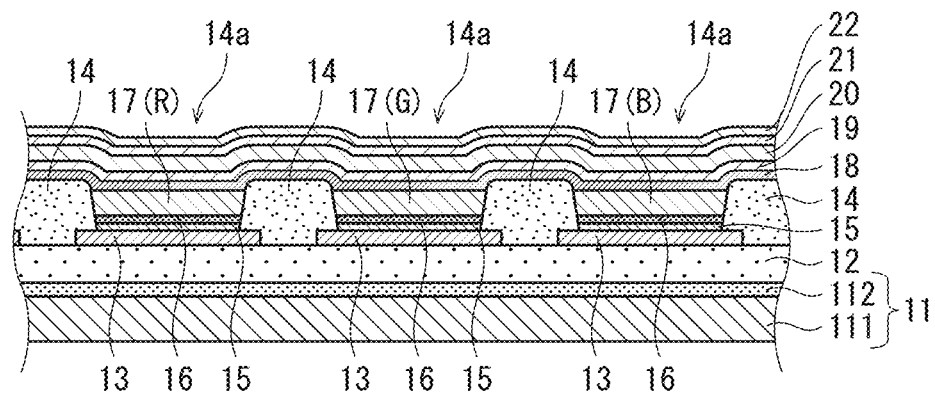

Finally, as illustrated in FIG. 10C, the sealing layer 22 is formed on the counter electrode 21 (step S120 in FIG. 1). The sealing layer 22 can be formed by forming a film of SiON, SiN, or the like, by a sputtering method or CVD method. According to at least one embodiment, a sealing resin layer is applied on an inorganic film of SiON, SiN, or the like, and baked.

According to at least one embodiment, a color filter and an upper substrate are bonded onto the sealing layer 22.

8. Overall Structure of Organic EL Display Device

Figure 12:
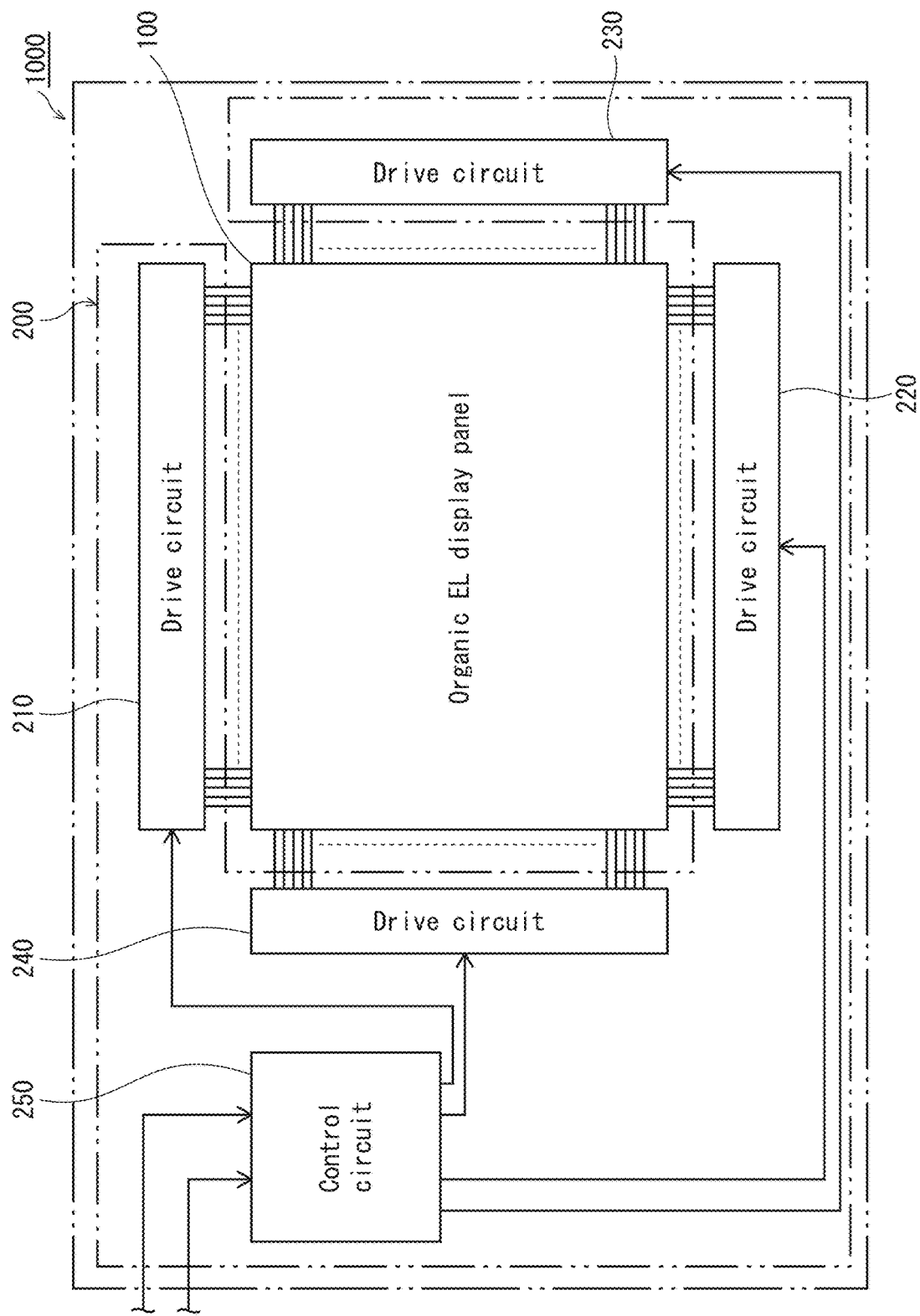
FIG. 12 is a block diagram illustrating structure of an organic EL display device that includes organic EL elements according to at least one embodiment.

FIG. 12 is a schematic block diagram illustrating structure of an organic EL display device 1000 that includes the organic EL display panel 100. As illustrated in FIG. 12, the organic EL display device 1000 includes the organic EL display panel 100 and a drive controller 200 connected to the organic EL display panel 100. The drive controller 200 includes four drive circuits 210, 220, 230, 240 and a control circuit 250.

The organic EL display device 1000 is not limited to this arrangement of the driver controller 200 relative to the organic EL display panel 100.

9. Other Modifications (1) According to at least one embodiment, hole transportability is higher than electron transportability in the light-emitting layer 17, but even if electron transportability is higher than hole transportability in the light-emitting layer 17, the structure according to the present disclosure is possible.

Figure 13A:
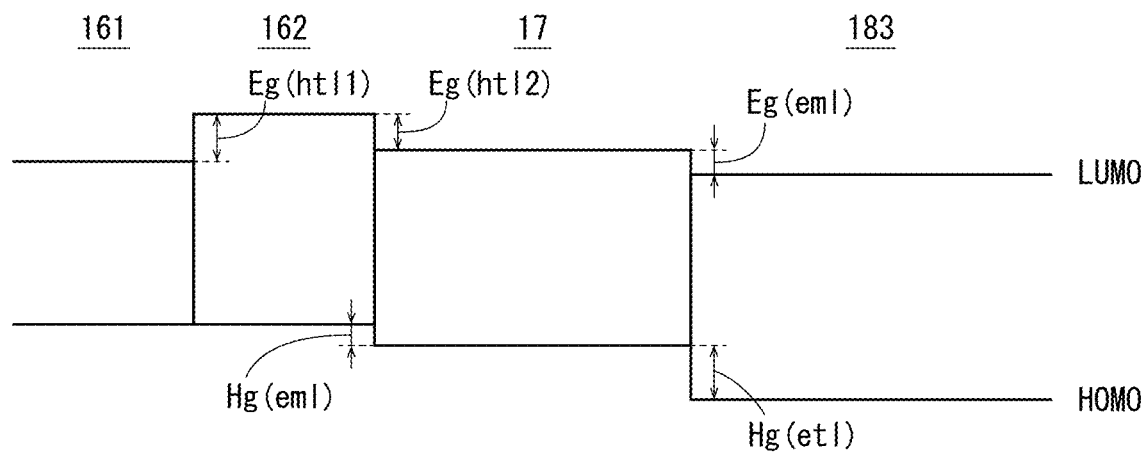
FIG. 13A, 13B are simplified schematic diagrams illustrating band diagrams and electron and hole recombination positions of hole transport layers, light-emitting layers, first electron transport layers, and second electron transport layers, according to a modification.

FIG. 13A is a band diagram illustrating a case in which electron transportability is higher than hole transportability in the light-emitting layer 17. In this case, a hole injection barrier Hg(htl1) from a first hole transport layer 161 to a second hole transport layer 162 is 0 eV. A hole injection barrier Hg(eml) from the second hole transport layer 162 to the light-emitting layer 17 is 0.1 eV. On the other hand, an electron injection barrier Eg(eml) from the electron transport layer 183 to the light-emitting layer 17 is 0.11 eV.

An electron injection barrier Eg(htl2) from the light-emitting layer 17 to the second hole transport layer 162 preferably satisfies Expression (6), below. The electron injection barrier Eg(htl2) more preferably satisfies Expression (7), below.

$$Eg(htl2) \geq 0.2 \text{ eV} \quad \text{Expression (6)}$$

$$Eg(htl2) \geq 0.4 \text{ eV} \quad \text{Expression (7)}$$

Further, when effective hole mobility of an entire hole transport layer including the first hole transport layer 161 and the second hole transport layer 162 is µh(htl), Expression (8) is preferably satisfied.

$$\mu h(eml) \geq \mu h(htl) \quad \text{Expression (8)}$$

Figure 13B:
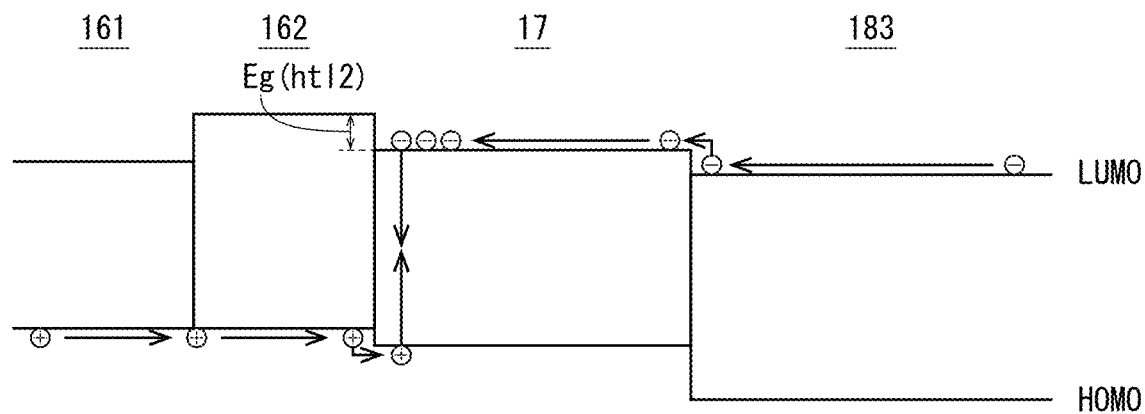

According to this structure, and as illustrated in FIG. 13B, an electron-hole recombination region in the light-emitting layer 17 can be a narrow region in the vicinity of the interface between the light-emitting layer 17 and the hole transport layer, and exciton density can be increased to improve luminance efficiency by TTF. Further, generation of excitons by recombination can be controlled by hole injection from the second hole transport layer 162 to the light-emitting layer 17, and deterioration of light-emitting material due to holes and excitons can be suppressed. Further, leakage of electrons from the light-emitting layer 17 to the second hole transport layer 162 is suppressed, and electron density in the vicinity of the interface between the light-emitting layer 17 and the second hole transport layer 162 can be improved. Accordingly, the recombination region can be prevented from expanding to outside the light-emitting layer 17, and in particular to the second hole transport layer 162, improving luminance efficiency and suppressing deterioration of functional material due to electrons and excitons.

(2) According to at least one embodiment, each of the light-emitting layers 17 are made of a single organic light-emitting material, but the light-emitting layers 17 are not limited to this. For example, each of the light-emitting layers 17 may be made of multiple materials, such as a fluorescent material and a host material. In such a case, the band diagram preferably satisfies the following conditions.

In a relationship between the light-emitting layer 17 and the first electron transport layer 18, when holes flow out from the light-emitting layer 17 to the first electron transport layer 18, the holes flow out from the main material of the light-emitting layer 17. Accordingly, the material of the first electron transport layer 18 and the main material of the light-emitting layer 17 preferably satisfy Expression (1) or Expression (2). Similarly, when electrons are injected from the electron transport layer to the light-emitting layer 17, electrons are injected to the main material of the light-emitting layer 17. Accordingly, the materials of the first electron transport layer 18 and the second electron transport layer 19 preferably satisfy Expression (4) with respect to the main material of the light-emitting layer 17.

In the case of Modification (1), as described above, similarly, the material of the second hole transport layer 162 preferably satisfies Expression (6) or Expression (7) with respect to the main material of the light-emitting layer 17, and the materials of the first hole transport layer 161 and the second hole transport layer 162 preferably satisfy Expression (8) with respect to the main material of the light-emitting layer 17.

(3) According to at least one embodiment, the hole injection layer 15 and the hole transport layer 16 are part of the organic EL element, but the organic EL element is not limited to this. For example, the organic EL element may have a structure without the hole transport layer 16. Another example is the organic EL element including a single hole injection transport layer instead of the hole injection layer 15 and the hole transport layer 16.

Further, according to at least one embodiment, the second electron transport layer 19 and the electron injection layer 20 are part of the organic EL element, but the second electron transport layer 19 may also serve as an electron injection layer. Similarly, in the case of Modification (1), as described above, the first hole transport layer 161 and the hole injection layer 15 may be included, or the first hole transport layer 161 may serve as a hole injection layer.

(4) According to at least one embodiment, electron mobility of the first electron transport layer 18 is lower than electron mobility of the second electron transport layer 19, but the organic EL element is not limited to this. Electron mobility of the first electron transport layer 18 may be higher than electron mobility of the second electron transport layer 19. For example, the organic EL element pertaining to the present disclosure may be implemented by using a functional material of the first electron transport layer 18 that satisfies Expression (1) or Expression (2) but has a higher electron mobility than the light-emitting layer 17, and using a functional material of the second electron transport layer 19 that has a low electron mobility so as to satisfy Expression (4).

(5) According to at least one embodiment, the LUMO level of the first electron transport layer 18 is equal to or lower than the LUMO level of the light-emitting layer 17, but the LUMO level of the first electron transport layer 18 may be higher than the LUMO level of the light-emitting layer 17 and higher than the LUMO level of the second electron transport layer 19. According to this structure, the electron injection barrier Eg(etl1) from the second electron transport layer 19 to the first electron transport layer 18 is large, and electron injection from the cathode 21 to the light-emitting layer 17 can be controlled. Further, if this structure is used and Expression (1) or Expression (2) is satisfied, the band gap of the first electron transport layer 18 is inevitably larger than the band gap of the light-emitting layer 17, and therefore exciton energy of the light-emitting layer 17 can be prevented from flowing out to the first electron transport layer 18.

(6) According to at least one embodiment, the organic EL display panel has a top-emission structure, but a bottom-emission structure may be used by having a light-transmissive electrode as the anode and a light-reflective electrode as the cathode.

Further, according to at least one embodiment, the anode is a pixel electrode and the cathode is a counter electrode, but the cathode may be a pixel electrode and the anode may be a counter electrode.

Although the technology pertaining to the present disclosure has been fully described by way of examples with reference to the accompanying drawings, it is to be noted that various changes and modifications will be apparent to those skilled in the art. Therefore unless such changes and modifications depart from the scope of the present disclosure, they should be construed as being included therein.

The invention claimed is:

1. An organic electroluminescence (EL) element comprising: an anode; a light-emitting layer; a functional layer; and a cathode stacked in this order, wherein
    the light-emitting layer and the functional layer are in contact with each other,
    hole mobility of the light-emitting layer is greater than electron mobility of the light-emitting layer,
    the electron mobility of the light-emitting layer is greater than an effective electron mobility of the functional layer, and
    a highest occupied molecular orbital (HOMO) level of a first functional material included in the light-emitting layer is at least 0.4 eV greater than a HOMO level of a second functional material included in the functional layer.

2. The organic EL element of claim 1, wherein
    the functional layer includes a first functional sublayer in contact with the light-emitting layer and a second functional sublayer in contact with the first functional sublayer,
    the second functional material is included in at least the first functional sublayer, and
    the effective electron mobility of the functional layer is a value derived from an electron mobility of the first functional sublayer and an electron mobility of the second functional sublayer, averaged and weighted by film thickness of the first functional sublayer and film thickness of the second functional sublayer.

3. The organic EL element of claim 1, wherein
    a lowest unoccupied molecular orbital (LUMO) level of the first functional material is at least a LUMO level of the second functional material.

4. The organic EL element of claim 1, wherein
    a distance between a light emission center of the light-emitting layer and a cathode-side surface of the light-emitting layer is shorter than a distance between the light emission center of the light-emitting layer and an anode-side surface of the light-emitting layer.

5. The organic EL element of claim 1, wherein
    singlet exciton energy in the second functional material is greater than singlet exciton energy in the first functional material.

6. The organic EL element of claim 1, wherein
    triplet exciton energy in the second functional material is greater than triplet exciton energy in the first functional material.

7. An organic electroluminescence (EL) display panel comprising:
    a plurality of organic EL elements on a substrate, each of the organic EL elements comprising: an anode; a light-emitting layer; a functional layer; and a cathode stacked in this order, wherein
    the light-emitting layer and the functional layer are in contact with each other,
    hole mobility of the light-emitting layer is greater than electron mobility of the light-emitting layer,
    the electron mobility of the light-emitting layer is greater than an effective electron mobility of the functional layer, and
    a highest occupied molecular orbital (HOMO) level of a first functional material included in the light-emitting layer is at least 0.4 eV greater than a HOMO level of a second functional material included in the functional layer.

8. An organic electroluminescence (EL) element comprising: an anode; a functional layer; a light-emitting layer; and a cathode stacked in this order, wherein
    the light-emitting layer and the functional layer are in contact with each other,
    electron mobility of the light-emitting layer is greater than hole mobility of the light-emitting layer,
    the hole mobility of the light-emitting layer is equal to or greater than an effective hole mobility of the functional layer, and
    a lowest unoccupied molecular orbital (LUMO) level of a first functional material included in the light-emitting layer is at least 0.4 eV less than a LUMO level of a second functional material included in the functional layer.

9. An organic electroluminescence (EL) element comprising: an anode; a functional layer; a light-emitting layer; and a cathode stacked in this order, wherein
    the light-emitting layer and the functional layer are in contact with each other,
    electron mobility of the light-emitting layer is greater than hole mobility of the light-emitting layer,
    the hole mobility of the light-emitting layer is less than an effective hole mobility of the functional layer, and
    a lowest unoccupied molecular orbital (LUMO) level of a first functional material included in the light-emitting layer is at least 0.2 eV less than a LUMO level of a second functional material included in the functional layer.

* * * * *